(12) United States Patent
Haustein et al.

(10) Patent No.: US 12,092,674 B2
(45) Date of Patent: Sep. 17, 2024

(54) METHOD AND MEASUREMENT ENVIRONMENT, APPARATUS TO BE TESTED

(71) Applicant: Fraunhofer-Gesellschaft zur Foerderung der angewandten Forschung e.V., Munich (DE)

(72) Inventors: Thomas Haustein, Berlin (DE); Paul Simon Holt Leather, Berlin (DE); Ramez Askar, Berlin (DE); Leszek Raschkowski, Berlin (DE); Marcus Grossmann, Erlangen (DE); Markus Landmann, Erlangen (DE)

(73) Assignee: Fraunhofer-Gesellschaft zur Foerderung der angewandten Forschung e. V., Munich (DE)

(*) Notice: Subject to any disclaimer, the term of this patent is extended or adjusted under 35 U.S.C. 154(b) by 737 days.

(21) Appl. No.: 17/129,561

(22) Filed: Dec. 21, 2020

(65) Prior Publication Data

US 2021/0109145 A1    Apr. 15, 2021

Related U.S. Application Data

(63) Continuation of application No. PCT/EP2019/066266, filed on Jun. 19, 2019.

(30) Foreign Application Priority Data

Jun. 22, 2018  (EP) ..................................... 18179398
Nov. 2, 2018  (EP) ..................................... 18204132

(51) Int. Cl.
   G01R 29/08    (2006.01)
   G01R 29/10    (2006.01)
   (Continued)

(52) U.S. Cl.
   CPC .......... G01R 29/0871 (2013.01); G01R 29/10 (2013.01); H04B 7/0695 (2013.01); H04B 17/11 (2015.01)

(58) Field of Classification Search
   CPC .. G01R 29/0871; G01R 29/10; H04B 7/0695; H04B 17/11; H04B 7/06966; H04B 7/0408; H04B 7/088
   (Continued)

(56) References Cited

U.S. PATENT DOCUMENTS 9,954,279 B1 * 4/2018 Pabst .................. H04B 17/102
2011/0034191 A1   2/2011 Leabman
(Continued)

FOREIGN PATENT DOCUMENTS

AU    508390 B2    3/1980
CA    2033375 A1   4/1992
(Continued)

OTHER PUBLICATIONS

Intel Corporation, et al., "UE testing interface for NR RF", vol. RAN WG 4 No., Ljubljana, Slovenia; R4-167277 Oct. 10, 2016-Oct. 14, 2016. XP 051165982, Apr. 2016, 4 pages.
(Continued)

*Primary Examiner* — Ayodeji O Ayotunde
(74) *Attorney, Agent, or Firm* — Perkins Coie LLP; Michael A. Glenn

(57) ABSTRACT

A method for evaluating an apparatus having at least one antenna array, the apparatus configured for forming a plurality of communication beam patterns using the antenna array, includes positioning of the apparatus in a measurement environment or moving/switching the probe/link antenna(s) of the measurement environment around the apparatus adapted to measure beam patterns and controlling the apparatus so as to form a predefined beam pattern of the
(Continued)

plurality of communication beam patterns. The method includes measuring the predefined beam pattern using the measurement environment and/or the apparatus.

40 Claims, 18 Drawing Sheets

(51) Int. Cl.
*H04B 7/06* (2006.01)
*H04B 17/11* (2015.01)
(58) Field of Classification Search
USPC .................................................. 455/67.11
See application file for complete search history.

(56) References Cited

U.S. PATENT DOCUMENTS

| | | | |
|---|---|---|---|
| 2011/0084887 A1* | 4/2011 | Mow | G01R 29/10 343/703 |
| 2011/0237246 A1 | 9/2011 | Sen | |
| 2012/0230380 A1 | 9/2012 | Keusgen et al. | |
| 2014/0364065 A1 | 12/2014 | Pu et al. | |
| 2015/0146282 A1 | 5/2015 | Huber et al. | |
| 2016/0227368 A1 | 8/2016 | Sanderovich et al. | |

FOREIGN PATENT DOCUMENTS

| | | |
|---|---|---|
| CN | 201765324 U | 3/2011 |
| CN | 102508068 B | 9/2013 |
| CN | 107703494 A | 2/2018 |
| EP | 2750303 A1 | 7/2014 |
| EP | 3104539 A1 | 12/2016 |
| EP | 3273257 A1 | 1/2018 |
| JP | 2008118484 A | 5/2008 |
| JP | 2012251903 A | 12/2012 |
| JP | 2013501480 A | 1/2013 |
| JP | 2016178677 A | 10/2016 |
| JP | 2016539505 A | 12/2016 |
| KR | 20130044191 A | 5/2013 |
| KR | 101744131 B1 | 6/2017 |
| KR | 20170115520 A | 10/2017 |
| WO | 2018030948 A1 | 2/2018 |

OTHER PUBLICATIONS

Zekavat, Seyed Alireza, et al., "Smart antenna arrays with oscillating beam patterns: Characterization of transmit diversity in semi-elliptic coverage", IEEE Transactions on Communications, IEEE Service Center Piscataway NJ. USA vol. 50. No. 10 Oct. 1, 2022 XP 011071035, Oct. 2002, 8 pages.

* cited by examiner

| Algorithm | Duration |
|---|---|
| % M is the number of link angles<br>% N is the number of measurement angles<br><br>1: For m = 1:M<br>2:      Rotate DUT in link-angle(m) direction<br>3:      Establish a link<br>4:      Lock beam<br>5:      Measure EIRP(m)<br>6:      For n = 1:N<br>7:           Rotate DUT in measurement-angle(n) direction<br>8:           Measure EIRP(m, n)<br>9:      end % n<br>10: end % m | <br><br><br><br>$T_{pos}$<br>$T_{est\text{-}link}$<br>$T_{lock}$<br>$T_{meas}$<br><br>$T_{pos}$<br>$T_{meas}$ |

Fig. 11a

| Algorithm | Duration |
|---|---|
| % M is the number of link angles<br>% N is the number of measurement angles<br><br>1: For m = 1:M<br>2:        Rotate DUT in link-angle(m) direction<br>3:        Establish a link<br>4:        Lock beam<br>5:        Store beam configuration(m)<br>6: end % m<br>7: For n = 1:N<br>8:        Rotate DUT in measurement-angle(n) direction<br>9:        For m = 1:M<br>10:             Recall beam configuration(m)<br>11:             Measure EIRP(m, n)<br>12:        end % m<br>13: end % n | <br><br><br><br><br>$T_{pos}$<br>$T_{est\text{-}link}$<br>$T_{lock}$<br>$T_{store}$<br>$T_{meas}$<br><br>$T_{pos}$<br><br>$T_{recall}$<br>$T_{meas}$ |

Fig. 11b

METHOD AND MEASUREMENT ENVIRONMENT, APPARATUS TO BE TESTED

CROSS-REFERENCES TO RELATED APPLICATIONS

This application is a continuation of copending International Application No. PCT/EP2019/066266, filed Jun. 19, 2019, which is incorporated herein by reference in its entirety, and additionally claims priority from European Applications Nos. 18 179 398.5, filed Jun. 22, 2018 and EP 18 204 132.7, filed Nov. 2, 2018, all of which are incorporated herein by reference in their entirety.

The present invention relates to an apparatus to be tested, e.g., in view of its wireless operation, to a measurement system and to a method for a testing of an apparatus. The present invention further relates to multi-beam switching/scanning and an enumeration/identification of beams/beam patterns, sometimes known as beam ID-ING.

BACKGROUND OF THE INVENTION

The ISO Open Systems Interconnection Standard with its layered model concept has been adapted in a variety of computer and telecommunication systems including those that are loosely known as 4G, beyond 4G, 5G and beyond 5G systems. Using this model, the circuitry that may be used to implement the functions of transmission and reception of raw data over a physical medium—the radio transceivers and their associated antenna systems—result in the so-called physical layer. Parameters used in the PHY layer thus control the way in which the radio transceiver(s) and their antenna system(s) operate. During normal operation, these parameters are controlled automatically to ensure that the communication system performs according to criteria determined by so-called higher layers.

At the same time, there exists a need for testing the devices in view of their performance in the wireless environment. Tests may be used to be fast and precise. Thus, there is a need to enhance wireless testing.

SUMMARY

According to an embodiment, a method for evaluating an apparatus having at least one antenna array, the apparatus configured for forming a plurality of communication beam patterns using the antenna array may have the steps of: positioning of the apparatus in a measurement environment or changing the relative position of the probe antenna/antennas of the measurement environment adapted to measure beam patterns and/or beam correspondence between a transmission beam pattern and a reception beam pattern; controlling the apparatus so as to form a predefined beam pattern of the plurality of communication beam patterns; and measuring the predefined beam pattern using the measurement environment and/or the apparatus.

According to another embodiment, a non-transitory storage medium having stored thereon a computer program having a program code for performing, when running on a computer, a method for evaluating an apparatus having at least one antenna array, the apparatus configured for forming a plurality of communication beam patterns using the antenna array, which method may have the steps of: positioning of the apparatus in a measurement environment or changing the relative position of the probe antenna/antennas of the measurement environment adapted to measure beam patterns and/or beam correspondence between a transmission beam pattern and a reception beam pattern; controlling the apparatus so as to form a predefined beam pattern of the plurality of communication beam patterns; and measuring the predefined beam pattern using the measurement environment and/or the apparatus.

Yet another embodiment may have a non-transitory storage medium having stored thereon a beam identification signal indicating a request to an apparatus to form a predefined beam pattern.

According to another embodiment, a measurement environment may have: a holding unit configured to hold an apparatus; and a control unit adapted to execute instructions, the instructions configured to cause the measurement environment and/or the apparatus to execute a method for evaluating an apparatus having at least one antenna array, the apparatus configured for forming a plurality of communication beam patterns using the antenna array, which method may have the steps of: positioning of the apparatus in a measurement environment or changing the relative position of the probe antenna/antennas of the measurement environment adapted to measure beam patterns and/or beam correspondence between a transmission beam pattern and a reception beam pattern; controlling the apparatus so as to form a predefined beam pattern of the plurality of communication beam patterns; and measuring the predefined beam pattern using the measurement environment and/or the apparatus.

Still another embodiment may have a controller adapted to: control an apparatus having at least one antenna array, wherein the apparatus is configured for forming a plurality of communication beam patterns using the antenna array, so as to form at least one predefined beam pattern of the communication beam patterns using beam related information; control a measurement environment so as to measure the predefined beam pattern using the beam related information.

The inventors have found that for testing an apparatus it is of advantage to predefine one or more beam patterns to be formed by the apparatus or device under test and to measure the formed beam pattern so as to allow evaluation of the behavior of the apparatus. By directly controlling the apparatus so as to form the predefined beam pattern time for adjusting and/or moving the apparatus and/or a time for adjusting the apparatus, control the apparatus so as to form its beam pattern towards a link antenna, lock the beam and then to move the apparatus may be saved. As time for orienting or aligning an apparatus and/or moving an apparatus may be of orders longer when compared to the real measurement time, the invention allows to significantly reduce time for measurements and thus to enhance the measurements.

According to an embodiment, a method for evaluating a apparatus having at least one antenna array, the apparatus is configured for forming a plurality of communication beam patterns. Measuring the antenna array comprises positioning of the apparatus in a measurement environment adapted to measure beam patterns, controlling the apparatus so as to form a predefined beam pattern of the plurality of communication beam patterns and measuring the predefined beam patterns using the measurement environment. Controlling the apparatus so as to form the predefined beam pattern allows the predefined beam pattern to be obtained in a short time and thus for fast measurements.

According to an embodiment, the predefined beam pattern is a first of a plurality of predefined beam patterns, the plurality of predefined beam patterns being a subset of the plurality of communication beam patterns. The method comprises controlling the apparatus so as to form a second predefined beam pattern of the plurality of predefined beam pattern after measuring of the first predefined beam pattern. The method further comprises measuring the second predefined beam pattern using the measurement environment. By sequentially forming and measuring a plurality of predefined beam patterns, different beam patterns, probably along different directions, having a different number of lobes and/or nulls, lobe size or direction or the like may be measured one after the other and thus allows for saving time between two measurements in which an apparatus is moved.

According to an embodiment, the predefined beam pattern is a first of a plurality of predefined beam patterns. The plurality of predefined beam patterns is at least a subset of the plurality of communication beam patterns. The method comprises controlling DUTs as to form the predefined beam pattern and a third predefined beam pattern of the plurality of predefined beam patterns during measuring of the first predefined beam pattern, i.e., at least a first and a further predefined beam pattern are formed simultaneously. The method comprises measuring the third predefined beam pattern using the measurement environment. This allows for evaluating at least two predefined beam patterns at the same time and thus for further reducing the measurement time.

According to an embodiment, the apparatus is controlled so as to sequentially form the plurality of predefined beam patterns, or in the respective predefined beam pattern is measured with the measurement environment. The method comprises changing a relative position between the apparatus and the measurement environment after having measured the plurality of predefined beam patterns for one position/direction or while moving from one position to another. Changing the relative position may be obtained by moving the apparatus relative to the one or more probe antennas and/or by moving the one or more probe antennas relative to the apparatus. The method comprises repeating the controlling of the apparatus for forming and measuring the plurality of beam patterns or a further plurality of predefined beam patterns. The further plurality of beam patterns may comprise the same or a subset of predefined beam patterns of the first plurality. Alternatively or in addition, one or more of the predefined beam patterns of the further plurality may differ from the first plurality. That is to say, after having sequentially formed and measured some or all of the predefined beam patterns, the apparatus may be moved and afterwards, further useful beam patterns may be formed. By reducing the movement or even without movement just sampling in space with the measurement environment of the apparatus in time to those between forming the plurality of predefined beam patterns and measurement thereof, fast and precise measurements are enabled.

Alternatively or in addition to a change of the relative position between measurement environment) and apparatus embodiments relate to measuring the beam patterns over a sphere or e.g. first in cuts along an azimuth or elevation, or according to a 2D grid in azimuth and elevation with a certain number of sampling points in space.

According to an embodiment, the apparatus is controlled so as to form the plurality of predefined beam patterns and/or defer the plurality of predefined beam patterns in a predefined order. This allows for coordination/synchronicity of actions during a measurement, i.e., the measurement environment may clearly await a specific beam pattern and may evaluate the measured beam pattern against the expectations. E.g. in this way also the beam correspondence between Tx and Rx beams of the apparatus can be evaluated.

According to an embodiment, the method comprises determining the predefined beam pattern by selecting the predefined beam pattern from the plurality of communication beam patterns. For example, the predefined beam patterns may be selected from a list provided by the manufacturer so as to obtain a subset of the communication beam patterns that allows for a quick and/or precise evaluation of the apparatus.

According to an embodiment, the apparatus or a model or an example thereof so as to form a calibration beam pattern having receive and/or transmit beams, the calibration beam pattern being one of the plurality of communication beam patterns. The method further comprises storing a beam-related information indicating the calibration beam pattern in a memory. Controlling the apparatus may comprise a direct control of, for example, gain parameters or the like, or may comprise an automated control, for example, allowing the apparatus to form its beam pattern towards a link antenna. This allows for obtaining predefined beam patterns in absence or in addition to information provided by the manufacturer.

According to an embodiment a plurality of calibration beam patterns is formed and a corresponding plurality of beam-related information is stored in the memory so as to allow repeatedly and deterministically re-forming the plurality of calibration beam patterns as predefined beam patterns.

According to an embodiment, controlling the apparatus or the apparatus-model or an example so as to form the calibration beam pattern comprises positioning of the apparatus or the apparatus similar to the apparatus so as to comprise a relative position to a link antenna such that the apparatus forms the calibration beam pattern towards the link antenna. The parameters used by the apparatus or the apparatus similar to the apparatus so as to form the beam pattern towards the link antenna may describe the calibration beam pattern and may thus recall as beam-related information. Alternatively, the beam-related information may be derived from the parameters. For example, different calibration beam patterns may be named or labeled, e.g., using an identifier or the like such that the parameters in combination with the additional information forms the beam-related information.

According to an embodiment, controlling the apparatus or the apparatus-model or an example/comparable apparatus, i.e., an apparatus being like the apparatus 14, so as to form the calibration beam pattern comprises electronically switched or steered positioning of the apparatus related to the apparatus so as to comprise a relative position to multiple link antennas for different relative positions such that the apparatus forms the calibration beam pattern towards the multiple link antennas sequentially. The parameters used by the apparatus or the apparatus similar to the apparatus so as to form the beam pattern towards the multiple link antennas may describe the calibration beam pattern and may thus recall as beam-related information. For example, the apparatus may form the beam pattern sequentially, one after the other, towards a plurality of link antennas, and/or simultaneously to a plurality of link antennas. Alternatively, the beam-related information may be derived from the parameters. For example, different calibration beam patterns may be named or labeled, e.g., using an identifier or the like such that the parameters in combination with the additional information forms the beam-related information.

According to an embodiment, controlling the apparatus or the apparatus so as to form the calibration beam pattern comprises in addition to forming the calibration beam pattern controlling the apparatus so as to lock the beam pattern such that the apparatus maintains a relative orientation of the beam pattern relative to a surface of the apparatus when changing the relative position of the apparatus with respect to the link antenna or multiple link antennas. This may allow for first evaluating the formed calibration beam pattern before deciding whether to store the beam-related information in the memory or not.

According to an embodiment, the calibration beam pattern is a first calibration beam pattern. The beam-related information is a first beam-related information. The method further comprises changing the relative position between the apparatus or the apparatus similar to the apparatus and the link antenna such that the apparatus forms a second calibration beam pattern, e.g., when again directing its beam pattern towards the link antenna. Changing the relative position can be done mechanically or by switching to another link antenna with a different angular position. The latter can be also done by superposing a plurality of link antennas to form the link coming from arbitrary directions between the superposed plurality of link antennas. The method comprises storing a second beam-related information indicating the second calibration beam pattern in the memory. Thereby, a plurality of calibration beam patterns may be stored through the respective beam-related information, thereby defining the predefined beam patterns.

According to an embodiment, the controlling of the apparatus so as to form the predefined beam pattern comprises reading the beam-related information from the memory and forming the predefined beam pattern according to the beam-related information. This allows for a quick forming of the beam pattern.

According to an embodiment, the beam-related information comprises at least one of a beam identifier, an information indicating one or a multitude of beam-related parameters for a transmission and/or a reception beam, e.g., gain(s), power, absolute or relative phase or the like, to be applied to the antenna array and/or the associated baseband signal which is to be communicated, i.e., transmitted and/or received, using the antenna array, a beam polarization, a carrier frequency of the beam pattern, a beam correspondence flag, e.g., indicating a beam correspondence between a receive beam and a transmission beam, a beam correspondence ID, e.g., the beam/beam sweep identifier of the correspondent receive beam and/or transmission beam/beam sweep or the like. Such information is interpreted by the apparatus so as to form the beam accordingly. This allows for characterizing the beam pattern according to the needs of the measurement environment.

According to an embodiment, controlling of the apparatus so as to form the predefined beam pattern of the plurality of communication beam patterns comprises transmitting a signal to the apparatus by the measurement environment, the signal containing information indicating at least one of a time duration of the predefined beam pattern, a time duration of a beam sweep comprising the predefined beam pattern, a time at the apparatus or the measurement environment so as to enable time synchronization, and/or an order of predefined beam patterns to be formed by the apparatus, an Tx-Rx flag allowing to identify if receive beam patterns or transmit beam patterns are measured, e.g., to guarantee in half duplex that the Tx power is off when measuring the Rx, e.g. to be used if the apparatus signaled that beam correspondence exists between Tx and Rx, and a beam identifier. Such information may be stored within the memory and may be indicated, for example, by indicating an entry of the codebook, i.e., by using an identifier. A codebook may contain a set of identifiable directions/radiation patterns that cover a part or the whole angular space used for communication. Alternatively or in addition, at least one of the parameters may be indicated in the signal transmitted to the apparatus so as to allow for flexibly adapting to the measurement, for example, with regard to a time being set for forming and maintaining a predefined beam pattern.

According to an embodiment, the beam-related information is stored in a memory of the apparatus. The signal indicates the beam-related information. This allows for low communication load as the respective useful information is already stored at the apparatus.

According to an embodiment, the controlling of the apparatus so as to form the predefined beam pattern comprises transmitting a signal from the measurement environment to the apparatus, the signal comprising information unambiguously indicating the beam pattern or sequence of a plurality of predefined beam patterns to be formed by the apparatus. This allows measuring the behavior of the apparatus and evaluating the behavior against a desired condition or a target state identified by the signal.

According to an embodiment, measuring the predefined beam pattern comprises at least one of measuring a total radiated power of the beam pattern, measuring an equivalent isotropic radiated power, measuring an effective isotropic sensitivity; measuring Rx and/or Tx complex radiation pattern in magnitude and phase; measuring Rx and/or Tx complex radiation pattern in relative magnitude and relative phase; measuring a direction of the beam pattern relative to the apparatus and measuring of a spherical coverage, a covered spherical beam grid density, a specific beam pattern of all activated beams in the set of beams, at least one side lobe of the main beam/beam patterns, a scalability/linearity, hysteresis of beam pattern changes/switching/inflating/deflating, spurious missions and/or adjacent channel leakage ratio, probably with spatial resolution, a capability and accuracy of null steering and multi-beam steering, an accuracy of a beam correspondence, e.g., between Tx and Rx beams, a calibration of antenna arrays/panels or the like. This allows for accurately evaluating the formed beam pattern.

According to an embodiment, measuring the predefined beam pattern comprises measuring of in-band emissions of a communication band utilized by apparatus. This allows for evaluating the in-band behavior of the apparatus.

According to an embodiment, measuring the predefined beam pattern further comprises measuring out-of-band emissions of the communication band. This allows for characterizing the interference behavior of the apparatus.

According to an embodiment, the apparatus is adapted so as to use at least a first and a second beam for superpositioning so as to form a combined beam in the predefined beam pattern. The individual beams may be distinguishable or indistinguishable for the measurement environment. The beams may be distinguishable, for example, by using different reference-pilots or reference-symbols that may be evaluated with the measurement environment, wherein, in case of only evaluating a transmission power, the single beams may remain indistinguishable. This may allow for a scalable degree of information obtained.

According to an embodiment, the predefined beam pattern is one of a plurality of predefined beam patterns. The apparatus is controlled so as to sequentially form each of the plurality of beam patterns, wherein the plurality of predefined beam patterns is arranged according to a pattern in the measurement environment. The pattern may be a regular or irregular pattern, a pattern in which the plurality of beams is arranged in an equidistant manner and/or a pattern that covers an azimuth and/or elevation angle range of the apparatus and/or a pattern with one or a superposition of polarization components. By selecting the plurality of predefined beams according to an also predefined pattern in the measurement environment high accuracies may be obtained during the measurement. According to an embodiment, when controlling the apparatus, the predefined beam pattern is formed independently from a link antenna. This allows simple measurement environments and/or a low interference for the measurements.

According to an embodiment, a non-transitory storage medium has stored thereon a computer program having a program code for performing, when running on a computer, a method according to an embodiment.

According to an embodiment, an apparatus comprises at least one antenna array. The apparatus is configured for forming a plurality of communication beam patterns using the antenna array. The apparatus comprises a memory having stored thereon beam-related information unambiguously indicating at least one of the plurality of communication beam patterns as a predefined beam pattern. The apparatus comprises an interface configured for receiving a signal indicating a request to form the predefined beam pattern. The apparatus is configured for forming the predefined beam pattern responsive to the signal using the beam-related information. For example, in case of measuring the receive beam the apparatus may feedback measurement results comprising one or more of a unique beam setting identifier
Received Signal strength Indicator
Reference Signal Received Power
Reference Signal Received Quality
Power e.g. in case of arbitrary test signals
Magnitude and phase at defined frequency
Relative magnitude and relative phase at a defined frequency
beam direction, like an angle of arrival.

According to an embodiment, a non-transitory storage medium has stored thereon a beam identification signal indicating a request to an apparatus to form a predefined beam pattern.

According to an embodiment, a measurement environment comprises a holding unit configured to hold an apparatus and a control unit adapted to execute instructions, the instructions configured to cause the measurement environment or apparatus to execute a method according to a method described in the present embodiments.

BRIEF DESCRIPTION OF THE DRAWINGS

Embodiments of the present invention will be detailed subsequently referring to the appended drawings, in which:

FIG. 11*a* shows an example table presenting the pseudo-code for a known measurement procedure;

FIG. 11*b* shows an example table presenting pseudo-code for a method in accordance with embodiments;

DETAILED DESCRIPTION OF THE INVENTION

Figure 1:
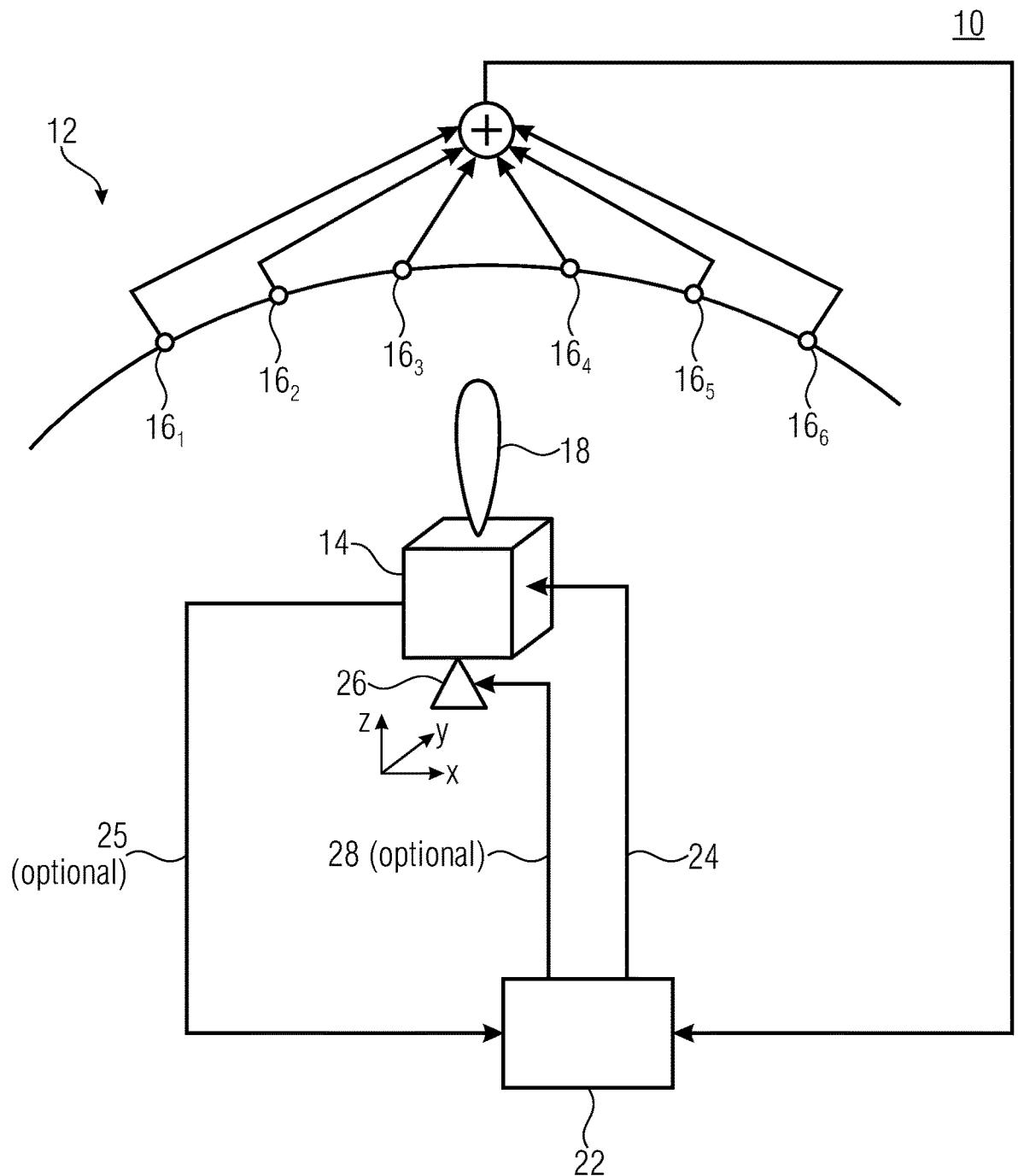
FIG. 1 shows a schematic block diagram of a measurement system, the measurement system comprising a measurement environment according to an embodiment.

Equal are equivalent elements or elements with equal or equivalent functionality are denoted in the following description by equal or equivalent reference numerals even if occurring in different figures.

Embodiments described herein may relate to an apparatus. The apparatus may be located, used and/or controlled in connection with a measurement environment or test environment. The apparatus may thus be referred to as device under test as being tested or at least dedicated to be tested. That is, even if currently being not tested, the apparatus may still be referred to as DUT without limiting the scope of the embodiments described herein.

Embodiments described herein may relate to antenna arrays used for forming beam patterns. An antenna array may comprise at least one antenna element and is configured within the scope of the described embodiments so as to form a transmission and/or reception beam i.e., a communication beam, with a varying direction/radiation pattern. An antenna array thus comprises of one or a multitude of radio wave emitting/receiving elements which allow an adaptive change of radiated/received beam patterns by means of e.g. parasitic capacity changes, use of several antenna elements with different phase and/or amplitudes.

An antenna array according to present embodiments may thus also be referred to as an array antenna, antenna panel or jointly operated multiple antennas/antenna arrays. For example, a single antenna element may comprise a radiating element configured for omnidirectional or directional radiating energy such as a monopole antenna, a dipole antenna, a patch antenna or a horn antenna. According to an embodiment, a parasitic element such as a capacitive element might be activated by a PIN diode and may be arranged so as to be effective with respect to the radiating element in at least one of an inactive and an active state. By being effective, the radiation along which at least a part of the radiated energy is directed or from which a signal may advantageously be received may be adjusted. Alternatively or in addition to the parasitic element at least a second radiating element may be arranged in the antenna array allowing for influencing or controlling the transmission and/reception direction by adapting a power of at least one radiating element and/or a phase.

Embodiments described herein may relate to one or more beam patterns formed by an apparatus. A beam pattern may comprise one or more beams. A beam may be understood as spatial directional property of an antenna array for transmit and/or receive purposes representing e.g. a specific antenna beam pattern formed by exploiting the superposition of the antenna pattern of the individual antenna elements to form the antenna array and phase and amplitude factors in between. That is, a transmitting/sending capability and/or receiving capability towards a specific direction, wherein this does not exclude forming the beam as an omnidirectional lobe. That is to say, the respective beam pattern may be a single-beam pattern or a multi-beam pattern. A beam may comprise one or more main lobes. Beside the beam, the beam pattern may comprise one or more side lobes. Between beams and/lobes and/or lobes, a null may be arranged. A lobe may be understood as a spatial region along which or from which signals are transmitted/received with a higher quality when compared to other regions. The beam pattern may comprise a null, e.g., between a first and a second lobe or at a different position. A null which may be understood as a spatial region along which or from which a low amount of transmission power is transmitted or from which signals are received with a lower quality when compared to the region of a lobe. E.g., the transmission power at a null may be lower when compared to the centre of a lobe by at least 20 dB, at least 40 dB or at least 60 dB or even more. Rephrased, forming a "null" may be understood that the formed beam pattern is spatially structured such that into a specific direction or spatial sector very little or in a perfect world no power is transmitted or received from. Such a "null" may be of importance in order not to cause interference into a specific direction, e.g., where another communication device A communicates with another communication device B on the same time frequency resources. In other words, the beam may comprise one or more lobes and may comprise nulls between lobes. A beam may be formed for transmission purposes, i.e., as a transmission beam which may be understood as directing transmission power for transmitting a wireless signal towards a specific direction relative to the apparatus. Alternatively or in addition, a beam may be formed for reception purposes, i.e., as a receiving beam, i.e., antenna gains are adjusted or controlled so as to generate an advantageous direction of reception of a wireless signal. The beam may be used for transmitting and/or receiving a signal at radiofrequency with a regular or irregular spatial pattern which may be used for beamforming.

Embodiments described herein refer to communication beam patterns, calibration beam patterns and predefined beam patterns. An apparatus capable of beamforming may be configured for forming one or more beams during normal operation, each beam being configured for transmission and/or reception purpose. Such beams are referred to as communication beam patterns. Calibration beam patterns may be a subset of communication beam patterns and may be obtained, for example, when controlling the apparatus or an apparatus beam similar hereto, i.e., a reference apparatus such as a model or of the same series to form a beam of the plurality of communication beam pattern. One or more parameters associated with the calibration beam pattern may be stored and/or read to or from a memory and applied to the apparatus so as to control the apparatus to form the beam pattern indicated by the parameter. Thus, by way of the at least one parameter, the formed beam is predefined such that a predefined beam pattern may be referred to as a recovered or restored version of a calibration beam pattern.

Embodiments described herein may relate to extended beam patterns. An extended beam pattern may be understood as a single beam pattern or a superposition of at least a first beam pattern and a second beam pattern, wherein such a superposition may be obtained for two or more transmitting beams or beam patterns, two or more receiving beams or beam patterns and/or at least one transmission beam or beam pattern and at least one receiving beam or beam pattern. I.e., when performing pattern locking according to embodiments, this may relate to beam locking and/or null locking. Beam locking may relate to lock one or more beams and/or lobes of a beam pattern, wherein null locking may relate to lock at least one null. Pattern locking may thus may also relate to lock elements of different beams or even one or more complete beams and/or to a combination of beam locking and null locking. In other words, a transmission comprises sending/transmitting a signal and receiving a signal. A communication parameter may relate to a parameter at least influencing a receiver property and/or a transmitter property. Embodiments therefore relate to transmission and/or reception and, without limitation to uplink and downlink.

Embodiments described herein refer to locking beam properties and/or at least a part of beam patterns. Locking in connection herewith may be understood as controlling the respective element or parameter so as to comprise an invariant status or at least a status comprising a low amount of change, e.g., less than 10%, less than 5% or less than 1%. Such a lock may be executed, for example, during normal operation during which said beam pattern or at least a part thereof and/or parameter are adapted, changed or controlled so as to comply with the requirements of the present operation. Based on the locking said beam, part thereof or parameter may be locked, i.e., preserved, frozen or maintained constant, probably within the above indicated tolerance range, such that the beam pattern and/or communication parameter remains as it is, even when changes of the apparatus, e.g., with respect to orientation or position, would cause a change thereof during normal operation as may be obtained when changing a relative position to a link antenna. A relative position in connection with embodiments described herein may relate to a vector in 3D space and/or to an orientation of one object to another such that when changing the orientation of one or both objects having the relative orientation, the relative position is thereby also changed. When referring to unlocking, the beam pattern, part thereof and/or communication parameter may be released such that adaptation according to the present operating mode may be performed.

Although having only one link antenna may be sufficient for the measurements, embodiments provide for measurement environments that have a plurality or a set of link antennas. According to an example, the plurality of link antennas $16_1$ to $16_{15}$ may be arranged so as to cover an elevation angle α and/or an azimuth angle β with respect to apparatus 14.

Embodiments relate to locking certain radiation pattern characteristics for the measurement of antennas that are used for transmitting signals, transmit or transmission antennas, and the measurement of antennas that are used for receiving signals, receive or reception antennas. Embodiments referring to the communication parameter thus cover both transmission and reception. Embodiments cover beam pattern properties which without loss of generality include time properties, frequency properties, spatial properties and coding properties for example space-time-codes, space-frequency codes and space-time-frequency codes.

FIG. 1 shows a schematic block diagram of a measurement system 10, the measurement system 10 comprising a measurement environment 12 and an apparatus 14. The measurement environment 12 may comprise one or more sensors $16_1$ to $16_6$, wherein a number of sensors may be at least one in any useful number. The sensors $16_1$ to $16_6$ may be configured, alone and/or in combination to evaluate a beam pattern 18 formed by the apparatus 14. That is, the measurement environment may be configured for measuring beam patterns. Alternatively or in addition, the measurement environment may measure, evaluate or determine a beam correspondence between a transmit beam pattern and a reception beam pattern. For an evaluation, the measurement environment 12 may comprise a control unit 22 configured for receiving information from the sensors $16_1$ to $16_6$. Although the sensors $16_1$ to $16_6$ may be arranged in any number according to any pattern, the sensors $16_1$ to $16_6$ may be arranged so as to partially or completely house a volume. Each of the sensors $16_1$ to $16_6$ may be a power sensor that may also be configured for measuring a phase and/or amplitude of the measured beam pattern.

Although being illustrated as forming a combined signal using a "+"-symbol, embodiments are not limited hereto but also relate to an individual measurement with an individual signal line to the control unit 22 or a switched configuration for sequentially using one or more sensors.

The control unit 22 may be configured to transmit a signal 24 to the apparatus 14 using a wired or wireless interface and to instruct the apparatus 14 so as to form the beam pattern 18.

The apparatus 14 may be configured for optionally transmitting a signal 25 to the measurement environment 12, e.g., to the controller 22. The signal 25 may comprise information indicating results, parameters or other information determined by the apparatus 14. For example, the apparatus 14 may measure or evaluate a Rx beam with regard to reception quality, beam preciseness and/or other properties. Respective results may be reported to the measurement environment 12 using the signal 25 so as to allow the measurement environment 12 to evaluate those results. Examples for information of interest that may be reported to the measurement environment 12 are a unique beam setting identifier, indicating a beam pattern formed by the apparatus, a Received Signal strength Indicator; a Reference Signal Received Power; a Reference Signal Received Quality; a power e.g. in case of arbitrary test signals; a frequency setting; a magnitude and phase at defined frequency; a relative magnitude and relative phase at a defined frequency; and/or a beam direction, like an angle of arrival. That is, in the Rx beam measurement case the measurement results may be feedback to the measurement environment by use of signal 25.

The measurement environment 12 further comprises a holding unit 26 configured to hold the apparatus 14. The holding unit 26 may comprise, for example, a table, a chuck, a JIG or an actuated fixture or the like. Further examples comprise a positioner, a turntable, a manipulator, a fixture, an assembly, a carrier, a frame, a holder, a grip, a conveyor, a track, an arm, a user and an electromagnetic phantom. An actuated fixture may allow for moving the apparatus 14 along at least one, two, three, four, five or six directions responsive to an optional signal 28 transmitted from the control unit 22 to the holding unit 26 using a wired or wireless interface.

Figure 2:
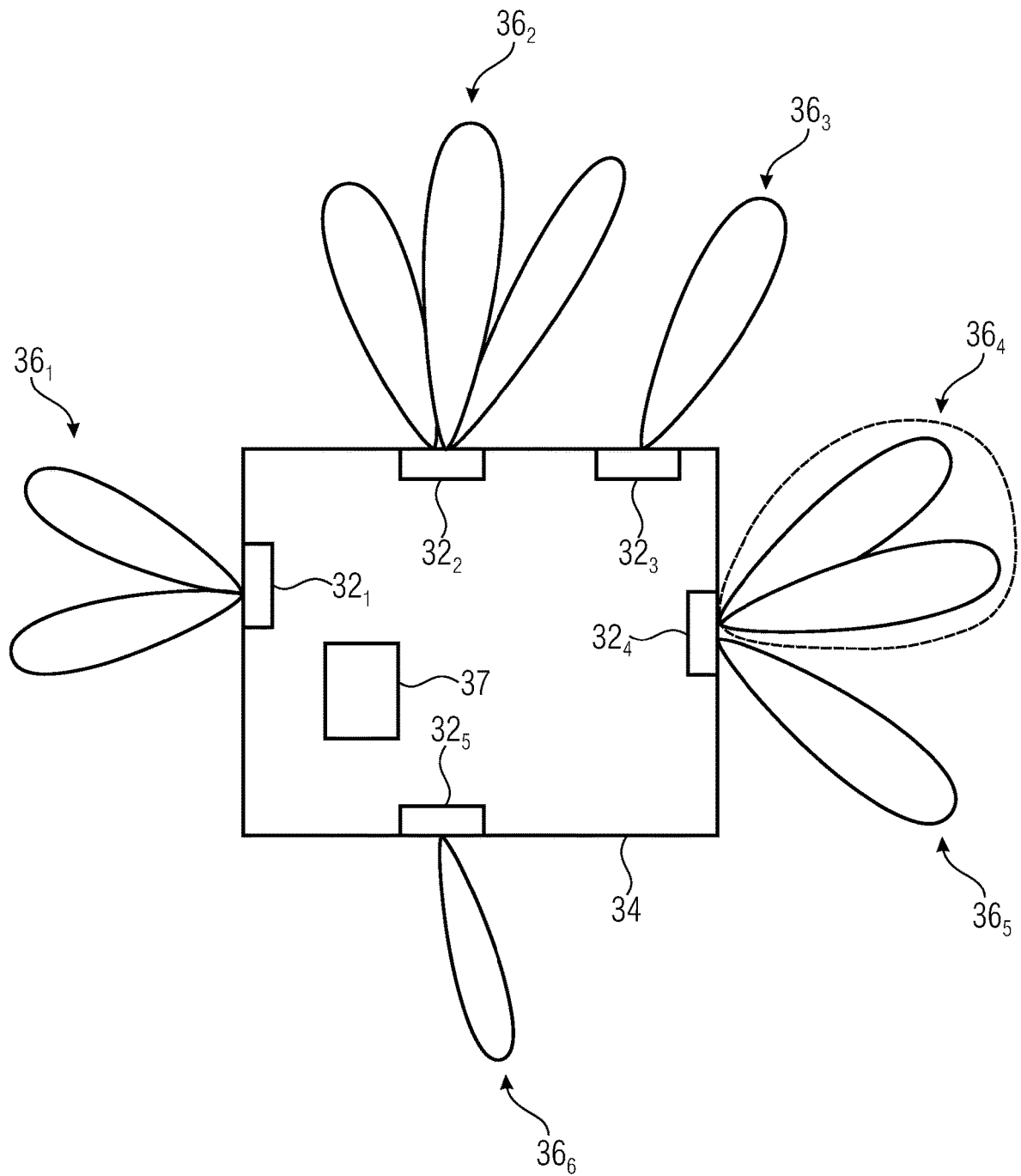
FIG. 2 shows a schematic block diagram of an apparatus according to an embodiment, which may be used as apparatus in the measurement environment of FIG. 1.

FIG. 2 shows a schematic block diagram of an apparatus 20, which may be used, for example, as apparatus 14 or as a model, example or reference for the apparatus 14. The apparatus 20 may comprise a number of at least one antenna arrays $32_1$ to $32_5$, wherein each of the antenna arrays $32_1$ to $32_5$ may be arranged inside a housing 34 of the apparatus 20, at the housing 34 or outside the housing 34. Each of the antenna arrays $32_1$ to $32_5$ may be configured for forming one or more beam communication beam patterns $36_1$ to $36_6$, each communication beam pattern $36_1$ to $36_6$ comprising one or more lobes and/or nulls formed for receiving and/or transmitting a signal.

Communication may then refer to those beam patterns that may be formed by the apparatus for communication, for example during normal operation of the apparatus 20. Communication beam patterns $36_1$ to $36_6$ therefore define the set of beam patterns that are formable with the apparatus 20. At least a subset thereof, i.e., one or more of the communication beam patterns 36 may be selected, defined or labeled as predefined beam pattern. During normal operation, the apparatus 20 may be configured for selecting a respective antenna array or antenna panels $32_1$ to $32_5$ that allows for forming a communication beam pattern $36_1$ to $36_6$ towards a link antenna or a base station. For measuring or evaluating the apparatus 20, it may be sufficient, to only evaluate a subset of those beams, wherein the one or more predefined beam patterns may provide for a broad basis for such measurements.

When referring again to FIG. 1, the apparatus 14 may be configured for generating one or more predefined beam patterns responsive to the signal 24 independent from a link antenna.

For example, the apparatus 14 may have stored in a memory a beam-related information that allows for forming the beam. The beam-related information may comprise one or more of a beam identifier, an information indicating one or more of a parameter to be applied to the antenna array and/or the associated baseband signal which is to be communicated using the antenna array, information indicating the respective antenna array, a beam polarization, a carrier frequency of the beam pattern or the like. In one embodiment, the beam-related information may have a structure according to a table in which respective beams are structured and named or labeled with a beam identifier such that, when receiving the signal 24 comprising a respective beam identifier, the requested beam might be formed with the apparatus 14 by reading the beam-related information associated with the beam identifier according to a codebook. The beam-related information may thus indicate properties of the beam pattern. Such indication may be directly such as "set power to 0 dB(m)" but may alternatively or in addition also be indirectly encoded and/or to be interpreted with respect to the property such as "set power to level 2".

The apparatus 20 may comprise a memory 37 configured for storing thereon beam-related information unambiguously indicating at least one of the plurality of communication beam patterns $36_1$ to $36_6$ as a predefined beam pattern. When using the apparatus 20 as apparatus 14, the memory 37 comprises respective beam-related information. According to an example, the signal 24 comprising information allowing identification of a predefined beam so that the signal 24 may also be referred to as a beam identification signal indicating a request to an apparatus 14 to form a predefined beam pattern may be stored on a nontransitory storage medium.

The beam related information may also be referred to as beam setting or beam parameter setting, i.e., a parameter or a set of parameters that advantageously unambiguously describe a beam pattern to be formed by the apparatus. A set of beam settings may also be referred to as a beam configuration which may comprise the parameter or set of parameters and/or a beam setting identifier associated with a beam setting identified thereby.

According to embodiments, the apparatus 20 and/or the apparatus 14 may be configured for operating responsive to instructions received from the measurement environment such as the measurement environment 12. The following description refers to a behavior of the apparatus/apparatus. Explanations given in connection with reception of a signal by the apparatus/apparatus thus also imply a respective signal transmitted by the measurement environment and vice versa.

An apparatus such as the apparatus 14 and/or the apparatus 20 may comprise at least one antenna array such as the antenna array 32 allowing the apparatus to form a plurality of communication beam patterns with the antenna array. The antenna array may be adapted as transmitter so as to form transmission beams and/or adapted as receiver so as to form reception beams, wherein both configurations may be implemented in parallel. Embodiments described in connection with a transmitter thus do not exclude a configuration of the antenna array as a transceiver or receiver.

The apparatus may be configured for signal a beam configuration of a formed communication beam pattern to the measurement environment, i.e., the apparatus may inform the measurement environment about a beam pattern that was formed, is currently formed or will be formed. The signaled beam configuration valid for Tx and/or Rx may comprise at least one of
 a unique beam setting identifier;
 a beam power;
 a beam gain;
 a beam directivity;
 a beam carrier frequency;
 a beam polarization;
 a beam direction;
 a beam bandwidth part;
 a beam usage,
 a list of values with the correspondent settings of the antenna arrays in Tx and/or Rx to form the beam
 a beam correspondence flag
 a beam correspondence ID As described, measurements may be performed for Tx beam patterns as well as for Rx beam patterns. A measurement environment in accordance with embodiments may be configured to receive, from the apparatus or DUT a result relating to at least one receive beam measurement associated with a unique beam identifiers comprising a plurality of measurement results and parameters. This may comprise one or more of but at least one of:
 a unique beam setting identifier
 a Received Signal strength Indicator
 a Reference Signal Received Power
 a Reference Signal Received Quality
 a Power e.g. in case of arbitrary test signals
 a frequency setting
 a Magnitude and phase at defined frequency
 a Relative magnitude and relative phase at a defined frequency
 a beam direction, like an angle of arrival.

An apparatus in accordance with embodiments such as apparatus 14 and/or 20 may accordingly be configured to feedback, receive beam measurement result(s) associated with unique beam identifiers comprising a plurality of measurement results and parameters, but at least one of:
 a unique beam setting identifier
 a Received Signal strength Indicator
 a Reference Signal Received Power
 a Reference Signal Received Quality
 a Power e.g. in case of arbitrary test signals
 a frequency setting
 a Magnitude and phase at defined frequency
 a Relative magnitude and relative phase at a defined frequency
 a beam direction, like an angle of arrival.

In accordance with an embodiment, the measurement environment may be configured to signal a trigger signal to the apparatus to initiate the feedback of receive beam measurement result(s) as described, i.e., associated with unique beam identifiers. Such measurement results may comprise, amongst other things, a received power/RSRP/RSSI or any metric related to received power or received magnitude and phase of a received signal. Such a trigger signal may be at least a part of a respective training signal used during training of the apparatus or measurement.

The mentioned apparatus may be configured to receive a trigger signal from the measurement environment initiate the feedback of receive beam measurement result(s) associated with unique beam identifiers.

The measurement environment and/or the apparatus may receive or transmit receive beam measurement results for a sequence of beam setting identifiers in response to a trigger signal.

That is, the apparatus may perform measurements regarding Rx beam patterns and thus evaluate reception quality. The apparatus may transmit, to the measurement environment, and optionally responsive to a trigger signal that may be received from the measurement environment such measurement results.

There may be certain scenarios in which one beam is constructed for a first purpose such as the purpose of communication while another beam is used for a different purpose such as reference purposes. These beams may differ in at least one of the following: power; carrier frequency; polarization; and/or direction. In addition, these beams also have a different purpose which may be indicted by a respective information.

The apparatus may be, for example, a communication device such as a UE like a smartphone, a tablet computer, base station, an antenna/communication module mounted on a vehicle or the like. The antenna array may be adapted as a transmitter. The apparatus may be configured for receiving from a measurement environment, a signal comprising a beam setting identifier, wherein the beam setting identifier is associated with a beam setting of the beam configuration. For receiving the signal, the apparatus may use a transceiver being a dedicated element or being available as an operation mode of the antenna array. For example, the signal 24 may be used for such transmission of information.

The apparatus may comprise a controller which may be a processor, a microcontroller, an application specific integrated circuit or the like, the controller configured to control the apparatus so as to form a communication beam pattern of the plurality of communication beam patterns according to the beam setting with the transmitter. I.e., the apparatus may follow the instructions of the environment so as to form a predefined beam pattern or a sequence thereof. For such purpose, the parameters to be applied may be transmitted to the apparatus and/or an identifier identifying such parameters may be transmitted.

When getting the beam setting signaled from the measurement environment, the beam configuration valid for Tx and/or Rx may contain one or more of a unique beam setting identifier;
  a beam power;
  a beam gain;
  a beam carrier frequency;
  a beam polarization;
  a beam direction;
  a beam bandwidth part;
  a list of values with the correspondent settings of the antenna arrays in Tx and/or Rx to form the beam;
  a Tx-Rx flag to identify if the Rx or Tx beam is measured e.g. to guarantee in half duplex that the Tx power is off when measuring the Rx, e.g. to be used if the DUT signaled that beam correspondence exists between Tx and Rx;
  a Rx Trigger to measure e.g. the received power/RSRP/RSSI or any metric related to received power or received magnitude and phase of the signal; and
  a beam usage.

Such signaling of the beam configuration may comprise transmission of a signal to the apparatus, the signal containing information that indicates the respective setting or parameter. That is, when referring to signaling of information or of a configuration, this may comprise transmitting a signal containing respective information.

The controller may be configured for applying the beam setting to form a predefined beam pattern being one of the plurality of communication beam patterns in receive and transmit at the apparatus.

The beam setting and/or the beam setting identifier may be one of a plurality of beam settings and/or beam setting identifiers, i.e., a sequence of beam settings and/or beam setting identifiers may be signaled from the measurement environment 12 to the apparatus, e.g., using signal 24. The sequence may transmit information about a plurality of beams that is requested to be formed and/or an information about the order thereof. The measurement environment may further transmit trigger signals to the apparatus. A reception of a respective trigger signal may instruct the apparatus so as to form the next predefined beam pattern indicated in the sequence. Each beam setting identifier of the sequence may be associated with a beam setting of a beam configuration of the apparatus, i.e., may unambiguously indicate one of the plurality of communication beam patterns. The controller may be configured for applying a first beam setting to form a first predefined beam pattern of the plurality of communication beam patterns with the transmitter in response to the first triggering signal, and for applying the second beam setting as indicated by the sequence to form a second predefined beam pattern of the plurality of communication beam patterns in response to the second triggering signal using the transmitter. This allows for first configuring the apparatus by transmitting the signal and then to perform fast switching by transmitting the trigger signals which may be short as an amount of information may be low. For example, an information according to "Next of the sequence" may be sufficient.

According to an embodiment, in case of measuring the receive beam, the apparatus may feedback measurement results comprising one or more of a unique beam setting identifier;
  an applied frequency and/or frequency band;
  Received Signal strength Indicator;
  Reference Signal Received Power;
  Reference Signal Received Quality;
  Power e.g. in case of arbitrary test signals;
  Magnitude and phase at defined frequency;
  Relative magnitude and relative phase at a defined frequency; and
  beam direction, like an angle of arrival.

Such feedback may be performed directly after measuring each beam or by storing it in the apparatus and feedback after some or all beams/the sequence of all beams are measured.

According to an embodiment, for applying a variation in view of beam patterns generated and alternatively or in addition, a so called beam-sweeping may be implemented, where a series of a spatially adjacent/neighboring beams are addressed creating a spatial sweep like moving a light beam through space, i.e., the beam is varied so as to continuously or discontinuously change its direction whilst remaining active. Considering such beam sweeps, each beams sweep may be addressed/IDed like the before mentioned static beams.

A beam sweep may thus comprise a change or altering of a parameter of the predefined beam pattern, i.e., of the beam setting, such as a direction, a focusing of one or more lobes, a polarization, a transmission power or the like. When applying one or more beam sweeps, during such a beam sweep, a power of certain segments of the beam sweep can be altered/changed over time. Such change in power, possibly in connection with a defined time duration may be part of a beam setting. The change/alteration may be executed, for example, whilst the beam pattern remains active. The apparatus may be controlled, for example, by a controller according to an embedment, so as to form a predefined beam pattern being a beam sweep, the beam sweep being based on a variation of a communication beam pattern over time.

In the same manner a series of beam sweeps can be used during the measuring process. Embodiments thus relate to define a predefined beam pattern as a beam sweep. By IDing the predefined beam pattern, thus, a beam sweep identifier may be used or generated.

When associating a predefined beam pattern with an identifier or the like, one or more identifiers may be associated with beam sweeps and/or one or more identifiers may be associated with possibly static predefined beam patterns. When compared to the static predefined beam patterns, parameters describing the beam sweep may comprise additional information such as a polarization change, a power change, a change of the direction and/or focus, a rate of a change, a start and/or end value, a time information or the like may be stored and/or recalled. Thereby, the beam setting identifier may still unambiguously identify a static predefined beam pattern and/or a beam sweep.

Alternatively or in addition, a time duration to be used for maintaining the predefined beam pattern fixed may be transmitted, for example, together with the sequence or as a separate signal. Such information may be referred to as a time duration indicator. The controller may be configured for applying sequentially in response to the triggering signal the beam settings one-by-one as indicated by the sequence, and wherein for each beam setting the apparatus is configured for forming the indicated predefined beam pattern of the plurality of communication beam patterns using the transmitter. The controller may be configured for keeping the formed predefined beam pattern fixed for a time duration indicated by the time duration indicator. Afterwards, the beam may be deactivated and/or a next beam may be formed or a subsequent trigger signal may be awaited.

According to an embodiment, the apparatus may be configured for transmitting a beamformed training signal responsive to a signal received from a measurement environment. Such a training signal may be, for example, a single continuous wave signal, a multi-sine signal, a sounding reference signal, a demodulation reference signal and/or a physical random access sequence signal. Such a training signal may be incorporated into one or more beams or beam patterns so as to allow distinguishing beams.

According to an embodiment, the apparatus of one of claims may be configured for receiving, from the measurement environment, a signal indicating a beam setting measurement request. This may be a request instructing the apparatus to report its capabilities, i.e., to inform the measurement environment about the communication beam patterns and/or predefined beam patterns it may generate. The measurement environment may evaluate the beam configuration capability during a measurement procedure. The apparatus may thereby be configured for reporting its beam configuration capability indicating the total number of supported beam settings of the beam configuration of the apparatus, to the measurement environment.

The controller may be configured for generating a beam setting as a part of the beam configuration of the apparatus; The controller may further be configured for applying the beam setting so as to form a beam pattern towards a link antenna that may be part of the measurement environment, using the transmitter. The controller may store the generated beam setting in a memory, i.e., it may store the beam setting used so as to obtain the direction towards the link antenna. The controller may control the apparatus so as to, in response to the beam setting measurement request, report the beam setting to the measurement environment. Based thereon, the measurement environment may evaluate or request a specific beam generated or to be generated with the transmitter.

Figure 3:
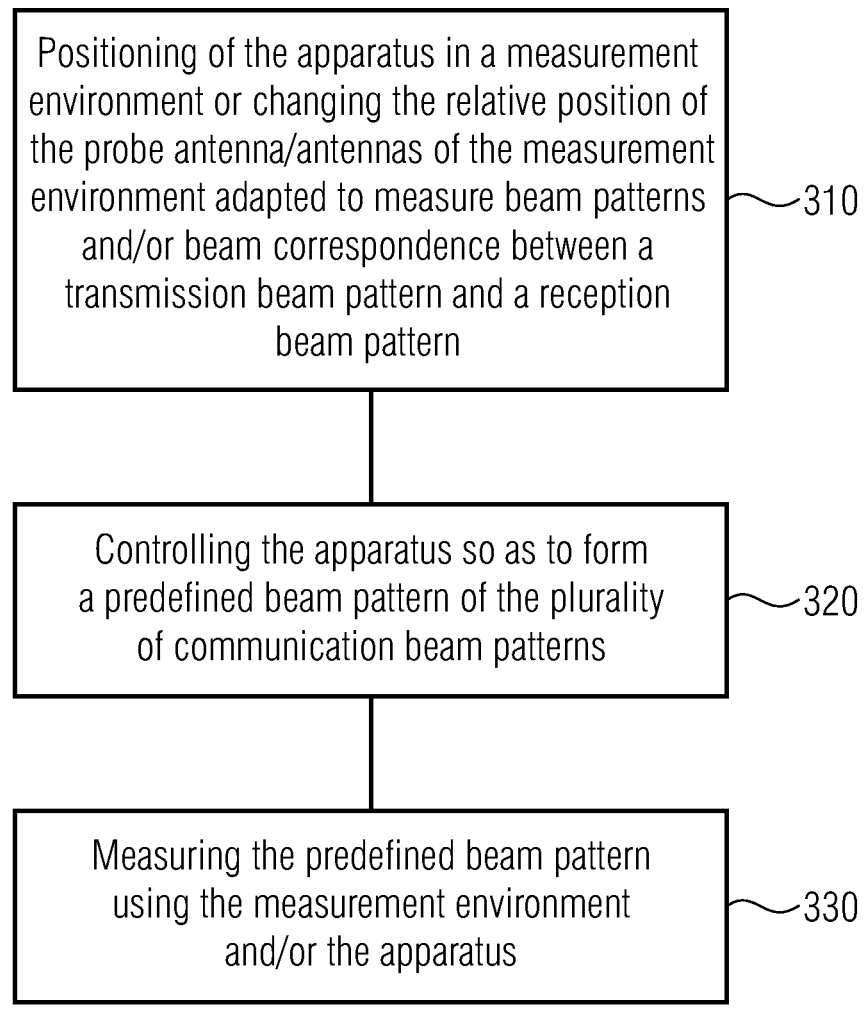
FIG. 3 shows a schematic flowchart of a method according to an embodiment.

FIG. 3 shows a schematic flowchart of a method 300 according to an embodiment. By executing method 300 an apparatus may be evaluated, for example, apparatus 14. The apparatus comprises at least one antenna array and is configured for forming a plurality of communication beam patterns using at least one antenna array. A step 310 comprises positioning of the apparatus or changing the relative position of the probe antenna/antennas of the measurement environment, e.g., by moving/switching the probe antenna(s) of the measurement environment around the apparatus in a measurement environment, e.g., the measurement environment 12 being adapted to measure beam patterns. A step 320 comprises controlling the apparatus so as to form a predefined beam pattern of the plurality of communication beam patterns. For example, the signal 24 may be transmitted to the apparatus so as to request the apparatus to form one or more beam patterns indicated in the signal 24. A step 330 comprises measuring the predefined beam pattern using the measurement environment to measure the Tx beam and requesting from the apparatus the Rx beam measurement if the Tx-Rx flag is set to Rx according to another embodiment.

Measurements and/or trainings measuring beams in connection with embodiments described herein may comprise a change of a relative position of the apparatus/DUT. A first possibility is to use a single link antenna having a first and a second polarization in connection with a mechanical movement, e.g., of the DUT and/or of the antenna. A second possibility is to use a plurality of link antennas used for sequential and/or parallel measurement in connection with the mechanical movement. A third possibility is to use the mentioned plurality of link antennas for sequential and/or parallel movement in absence of a mechanical movement of the DUT so as to measure all points/regions of the grid.

Figure 4:
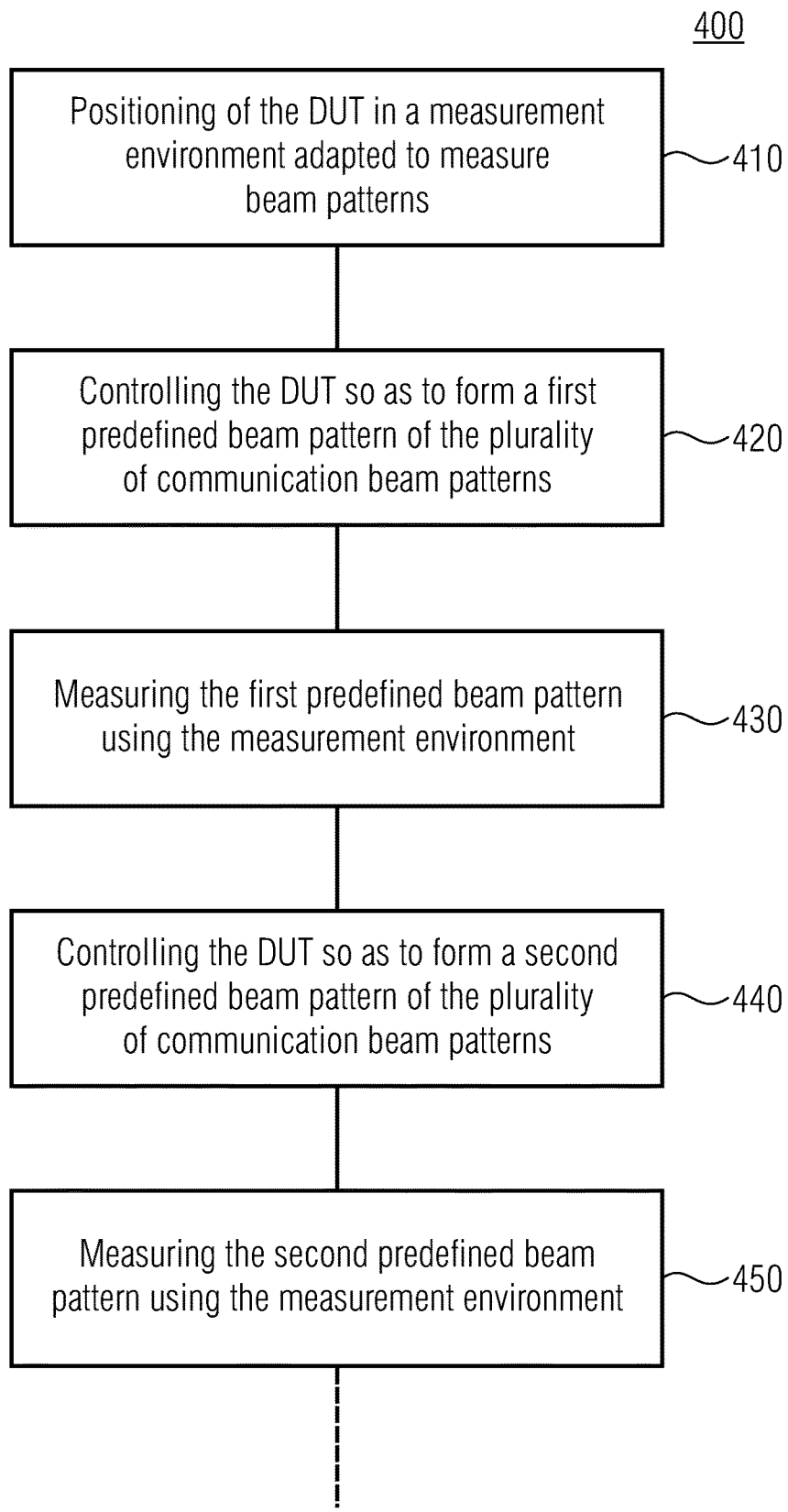
FIG. 4 shows a schematic flowchart of a method according to an embodiment in which measurement is repeated.

FIG. 4 shows a schematic flowchart of a method 400 according to an embodiment in which steps 410, 420 and 430 correspond to steps 310, 320 and 330 as described in connection with FIG. 3. Further, at least a second predefined beam pattern of the plurality of communication beam patterns is formed in a step 440, wherein a step 450 comprises measuring the second predefined beam pattern using the measurement environment and/or the apparatus the measure the receive beam. The second predefined beam pattern may be formed after having measured the first predefined beam pattern and/or may be measured simultaneously. Optionally, further predefined beam patterns may be measured. Thereby, a plurality of predefined beam patterns in Tx and/or Rx may be measured simultaneously and/or sequentially. Given a measured sequence, the sequence, i.e., the order of predefined beam patterns may also be predefined and may be indicated in the signal 24. For example, the signal 24 may comprise a command indicating either the use of an identified sequence such as sequence 1, sequence 2, sequence 3, . . . , sequence x and/or may comprise information indicating the sequence by containing a sequence of identifiers, each identifier associated with a predefined beam pattern. Alternatively or in addition, the signal 24 may be transmitted repeatedly so as to repeatedly control the apparatus so as to form the respective predefined beam pattern.

When controlling the apparatus so as to sequentially form the plurality of predefined beam patterns, the apparatus may be switched with respect to the beams formed after having measured the respective formed beam pattern. This may allow for maintaining a relative position of the apparatus in the measurement environment so as to save a large amount of time because a change of position may use a large amount of time. Therefore, at a specific position, the beam patterns of interest, i.e., the predefined beam patterns, may sequentially be formed and measured and afterwards, the apparatus may probably be changed with respect to its relative position in the measurement environment, e.g., again the apparatus is moved and/or the probe antenna(s) around the apparatus are moved or switched to a other position. After having changed the relative position of the apparatus, the apparatus may be controlled so as to form a further sequence of predefined beam patterns, i.e., a plurality of predefined beam patterns. The plurality of beam patterns or the sequence thereof are formed in a repetition, i.e., a second iteration.

Method 300 and/or 400 may be executed using a measurement environment such as the measurement environment 12 for evaluating a apparatus such as the apparatus 14. Precise results of the measurement or evaluation may be obtained when the apparatus and the measurement environment act in a coordinated manner. Thus, steps comprising controlling of the apparatus such as steps 310, 410 or 440 and/or steps for instructing the measurement environment to measure such as steps 330, 430 or 450 may be controlled by a dedicated or virtual/distributed controller, i.e., an entity that coordinates the components that may be used. The controller may at least partially be implemented in the apparatus, at least partially as part of the measurement environment, e.g., the control unit 22, or as a separate entity. Thereby it is also possible that the apparatus instructs the measurement environment by communicating its predefined test procedure to the measurement environment thereby controlling a behavior thereof and to perform the forming of the predefined beam pattern without autonomously, e.g., after having been set into a test mode or the like.

Such a controller may be configured for controlling an apparatus such as apparatus 14 or using the beam related information, for example, by providing a beam ID, other beam parameters and/or a sequence thereof to the apparatus. Further, the controller may inform or instruct, i.e., control the measurement environment so as to act in accordance with the measurement procedure to be performed by the apparatus such that the measurement environment and the apparatus act in a coordinated manner. I.e., the beam related information is also used for controlling the measurement environment. The controller may have access to information with respect to capabilities of the apparatus and the measurement environment. For example, such information may include a knowledge about a grid of sensors of the measurement environment and a granularity of beam patterns formable by the apparatus. The controller may select a test procedure, i.e., one or more predefined beam patterns in accordance with such information.

Figure 5:
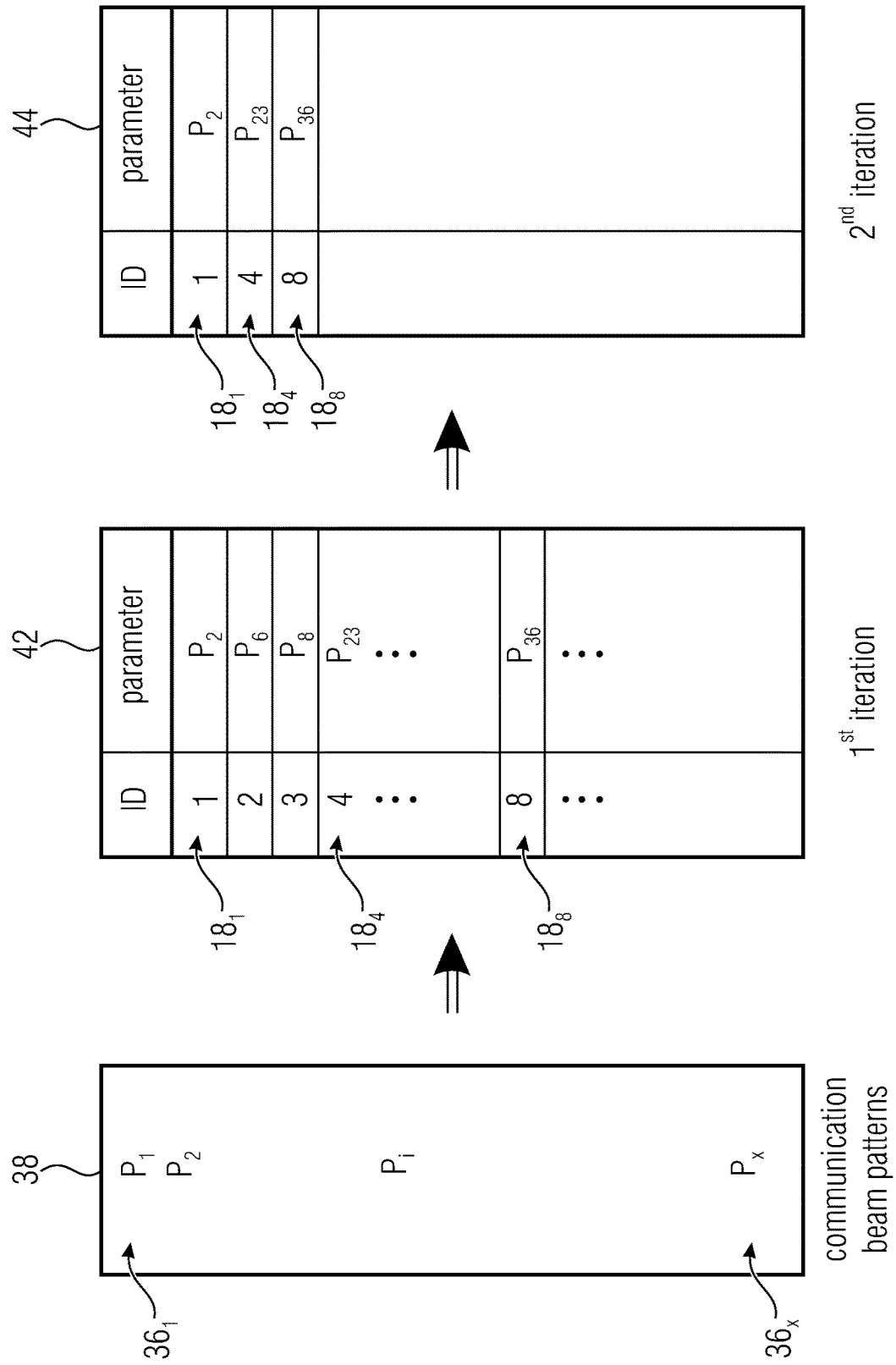
FIG. 5 shows a schematic diagram for illustrating the relationship between communication beam patterns and predefined beam patterns used in embodiments.

FIG. 5 shows a schematic diagram for illustrating the relationship between communication beam patterns and predefined beam patterns. A set 38 comprises sets $P_1$ to $P_x$ of parameters, each set $P_1$ to $P_x$ of parameters describing at least a part of a beam pattern that may be formed with the apparatus, for example, the apparatus 20 or the apparatus 14. Such a parameter set may be referred to as beam setting. At least a subset of the set 38 may be combined to a set 42 describing a plurality of predefined beam patterns. The set 42 may be formed and measured, for example, using the method 300 or 400.

After having measured the set 42 and after having changed the relative orientation of the apparatus a set 44 of predefined beam patterns may be formed and measured with the apparatus, wherein the set 44 may correspond to the set 42, may be a subset thereof and/or may comprise parameters $P_i$ not being contained in the set 42.

The apparatus may be controlled so as to form the plurality of predefined beam patterns of the set 42 and/or the plurality of predefined beam patterns 44 in a predefined order. This order may explicitly or implicitly be indicated in the signal 24, the order may be contained in the signal 24 or may be stored in a memory to which the apparatus has access such that the order may be derived from the information contained in the signal 24. When forming and measuring a plurality of the beam patterns, thus a predefined sequence of predefined beam patterns may be generated and measured with the measurement environment.

Figure 6:
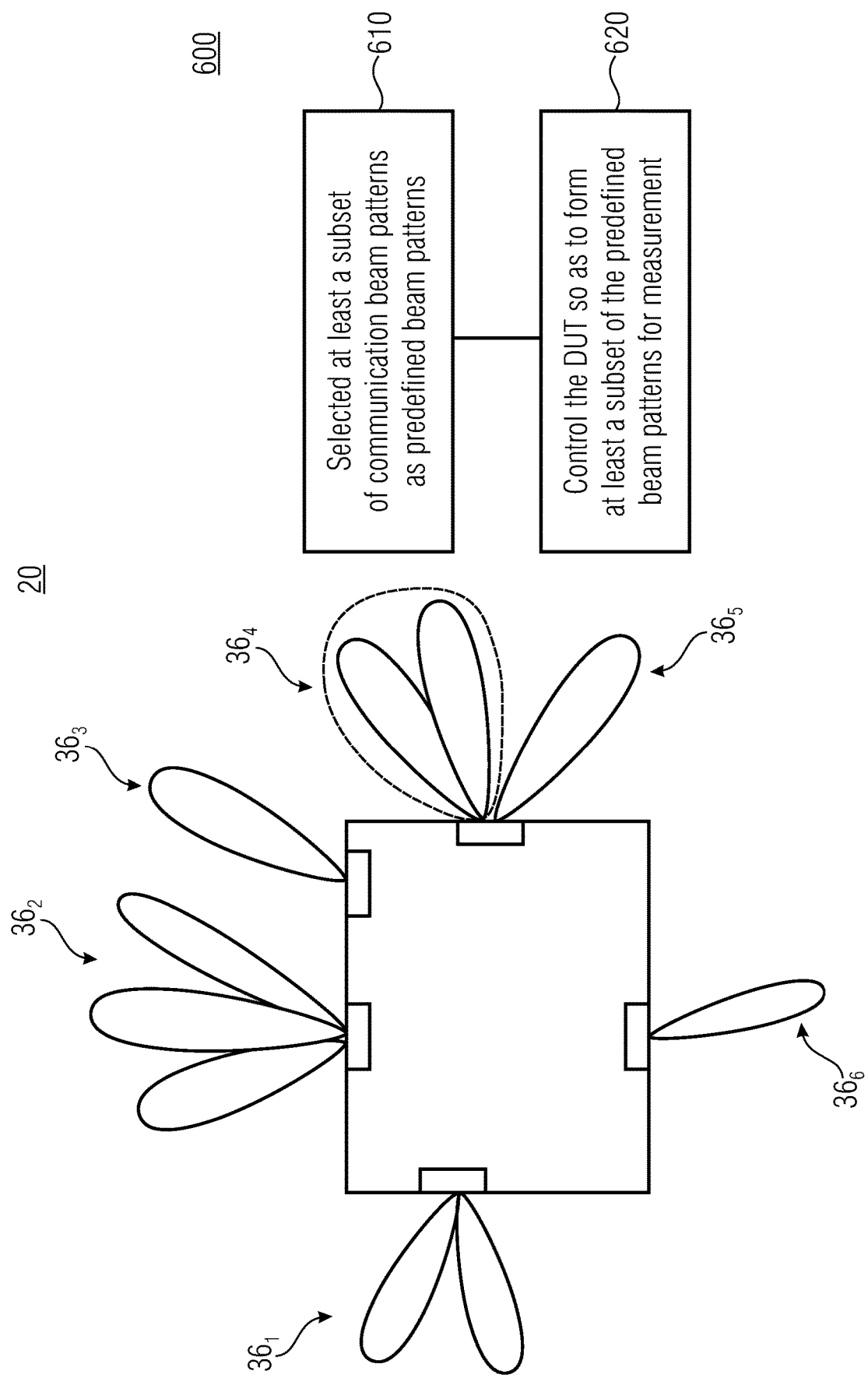
FIG. 6 shows a schematic flowchart of a method according to an embodiment, that may be performed so as to obtain a set of predefined beam patterns used in the methods of FIG. 3 or FIG. 4.

FIG. 6 shows a schematic flowchart of a method 600 that may be performed so as to obtain a set of predefined beam patterns, wherein the method 600 may partially be performed prior to executing the method 300 and/or 400. Method 600 comprises a step 610 in which at least a subset of communication beam patterns is selected as predefined beam patterns. Determining the predefined beam patterns by selection may be of advantage in a case where the beam properties are communicated by a manufacturer. A step 620 comprises controlling the apparatus so as to form at least a subset of the predefined beam patterns, e.g., set 42 and/or 44, for measurement, for example, in method 300 and/or 400.

Figure 7A:
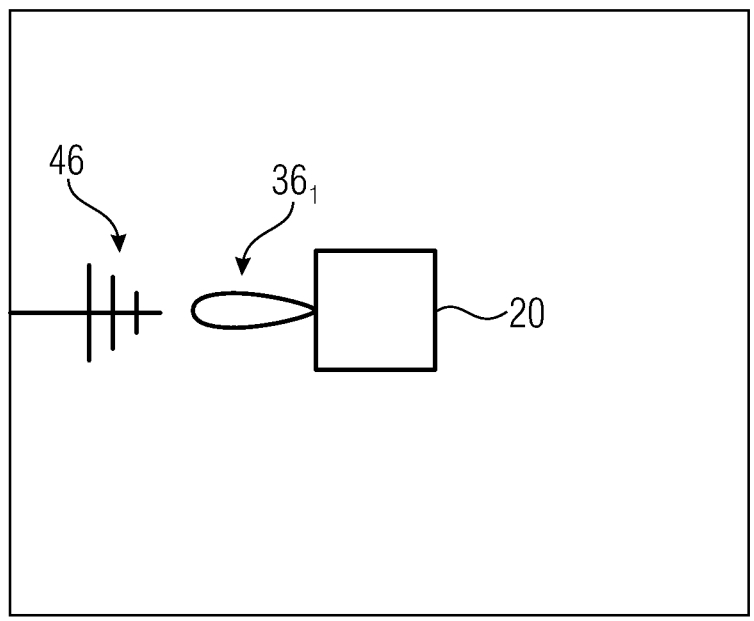
FIG. 7*a* shows a schematic block diagram of a calibration environment according to an embodiment, the calibration environment comprising a link antenna.

FIG. 7a shows a schematic block diagram of a calibration environment 70, the calibration environment 70 comprising a link antenna 46 that may be capable of simulating a behavior of a base station so as to cause the apparatus 20 to form a communication beam pattern, for example, the communication beam pattern $36_1$ towards the link antenna 46. Parameters used by the apparatus 20 so as to form the communication beam pattern $36_1$ may be stored, probably together with further information or derived information such as a beam identifier or the like, in the apparatus 20 or in another storage medium. The communication beam pattern $36_1$ may thus be referred to as a calibration beam pattern. For example, based on information signaled, such as a Tx-Rx flag, validity of the calibration beam pattern may be limited. For example, such as flag may indicate if the calibration beam pattern is valid for a Tx or Rx measurement or if no Tx-Rx flag is set for Tx and Rx and thus indicating a validity for both cases.

Figure 7B:
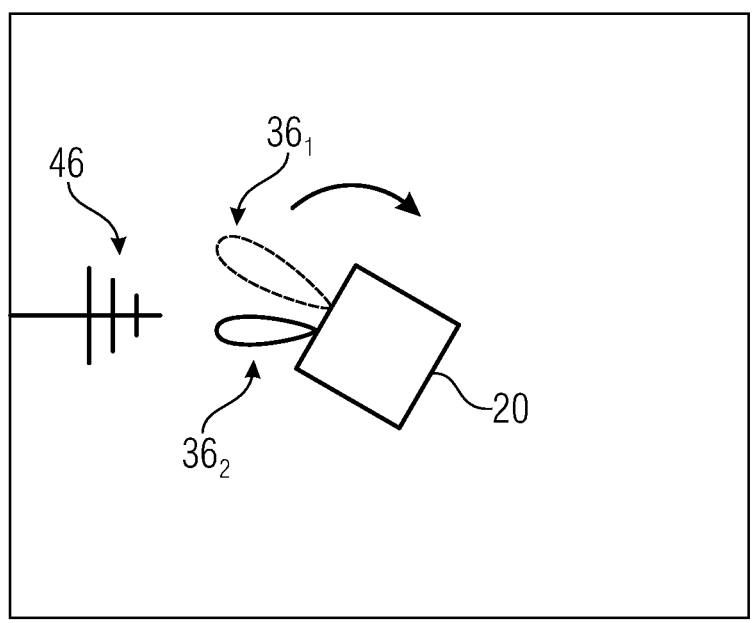
FIG. 7*b* shows a schematic block diagram of the calibration environment of FIG. 7*a* wherein the apparatus has been moved with respect to its relative position relative to the link antenna.

FIG. 7b shows a schematic block diagram of the calibration environment 70, wherein the apparatus 20 has been changed with respect to its relative position relative to the link antenna 46 such that the apparatus 20 forms a different communication beam pattern $36_2$ towards the link antenna 46. Changing the relative position to the link antenna may be achieved by rotating the DUT and/or selecting a link antenna at a different position. The communication beam pattern $36_1$ may thus be changed or deactivated. Alternatively, the apparatus 20 may be configured for locking the beam pattern $36_1$. Beam-locking may be understood as maintaining the communication beam pattern $36_1$, probably against the normal operation, such that a relative position of the communication beam pattern $36_1$ relative to the apparatus 20 is unchanged even if the relative position of the apparatus 20 relative to the link antenna 46 changes while the link antenna 46 is active. Again, parameters of the apparatus 20 used for generating the communication beam pattern $36_2$ may be stored in the memory. In the memory, there may be stored beam-related information as described in connection with FIG. 5.

The beam-related information may be stored in a memory of the apparatus 20 and/or the apparatus 14. For example, one sample of a series may be used for the calibration procedures apparatus 20 and each of the other apparatus may be equipped with the data derived, i.e., the beam-related information such that the apparatus 14 has access to the beam-related information even if it has not been calibrated on its own. Alternatively or in addition, the apparatus 20 itself may be used as an apparatus 14. In both cases, controlling the apparatus so as to form the predefined beam pattern comprises reading the beam-related information from a memory and forming the predefined beam pattern according to the beam-related information.

Figure 8:
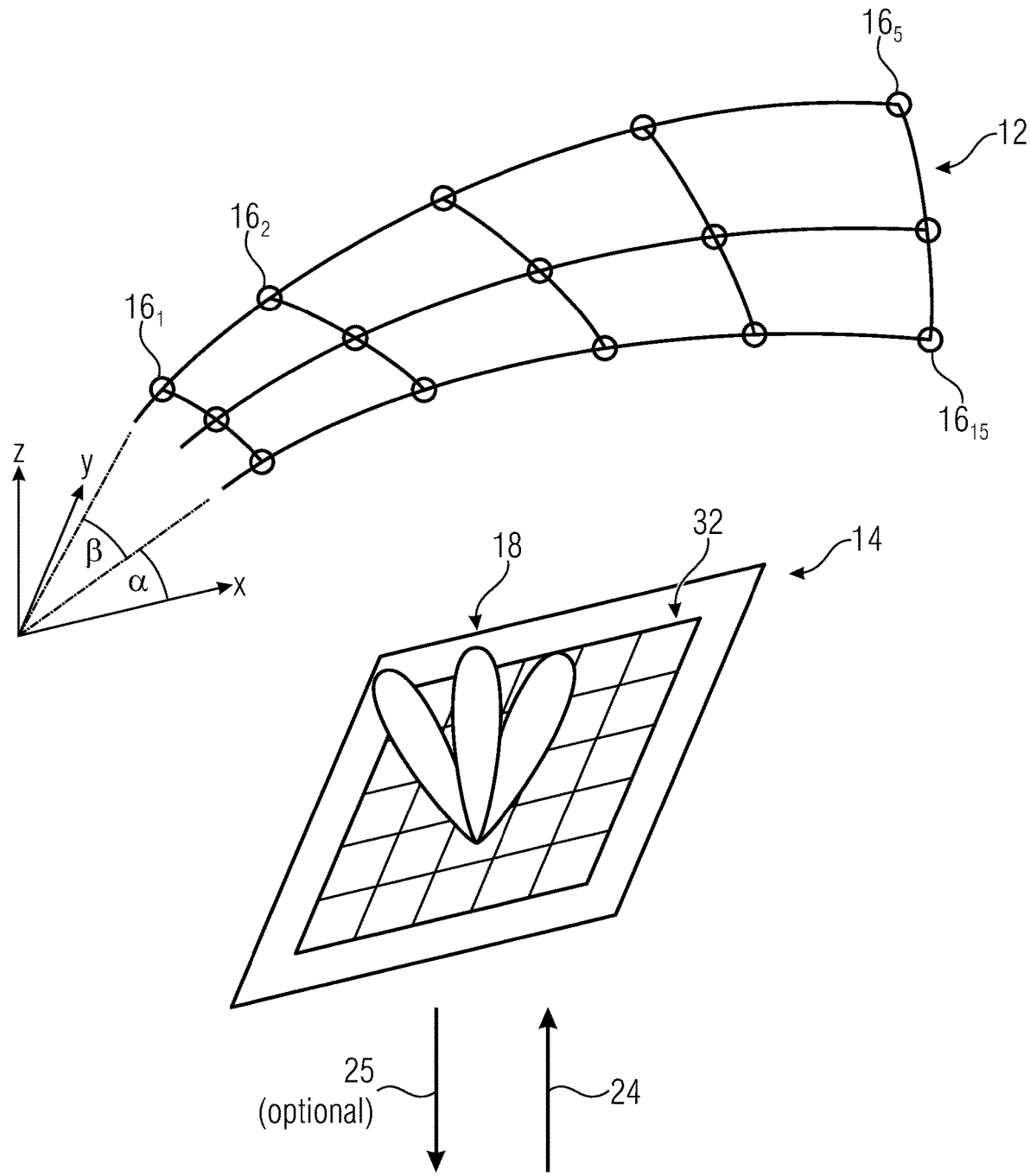
FIG. 8 shows a schematic block diagram of a part of the apparatus in the measurement environment of FIG. 1.

FIG. 8 shows a schematic block diagram of a part of the apparatus 14 in the measurement environment 12. Using the signal 24 and if applicable the signal 25, the apparatus may be controlled so as to form the predefined beam pattern 18. The signal 24 may comprise an identifier for identifying the predefined beam pattern 18 or a sequence of predefined beam patterns. Alternatively or in addition, the signal 24 may comprise information indicating a time duration of forming the predefined beam pattern and/or a time duration of a beam sweep comprising the predefined beam pattern, i.e., the sequence of forming predefined beam patterns, a time at the apparatus or at the measurement environment so as to enable time synchronization and/or an order of predefined beam patterns to be formed by the apparatus. The apparatus 14 may have access to a memory in which beam-related information such as parameters are stored. The signal 24 may indicate the beam-related information so as to indicate the apparatus 14 which beam-related information shall be used.

Advantageously, the signal 24 unambiguously indicates the predefined beam patterns or the sequence of predefined beam patterns to be formed by the apparatus. This allows for reliably evaluating the measured beam pattern against the expected results, i.e., it may be avoided that the apparatus 14 forms any other beam than the requested one.

According to an embodiment, the apparatus 14 is controlled so as to generate a sequence of predefined beam patterns. The sequence may comprise or consist of predefined beam patterns that are arranged according to a pattern in the measurement environment. The pattern may be a regular or irregular pattern. According to an example, the plurality of predefined beam patterns are arranged in an equidistant manner in one or more planes, for example, a plane comprising sensors $16_1$ to $16_{15}$. Alternatively or in addition, the pattern may cover at least a specific part of the angles & and/or B, i.e., at least a part of an azimuth and/or elevation angle range of the apparatus 14. Alternatively or in addition, the plurality of predefined beam patterns may form a pattern with one or a superposition of polarization components.

The measurement environment may comprise a set of sensors or probes $16_1$ to $16_{15}$. According to an example, the sensors $16_1$ to $16_{15}$ may be arranged so as to cover an elevation angle $\alpha$ and/or an azimuth angle $\beta$ with respect to apparatus 14. Measuring the predefined beam pattern may comprise one or more of measuring a total radiated power, measuring an equivalent isotropic related power, measuring a direction of the predefined beam pattern relative to the apparatus 14, measuring of a spherical coverage, for example, along the angles $\alpha$ and $\beta$, a covered spherical beam grid density, a specific beam pattern of all activated predefined beam patterns of the set of predefined beam patterns, at least one side lobe of the main beams/predefined beam patterns, a scalability/linearity/hysteresis of beam pattern changes/switching/inflating/deflating, spurious emissions and/or adjacent channel leakage ration, probably with a spatial resolution, a capability and accuracy of null steering and multi-beam steering of the apparatus 14, an accuracy of beam correspondence, i.e., a comparison of the beam that is actually generated when compared to a beam that is expected, and/or a calibration of antenna arrays/panels, and/or the correspondence between Rx and Tx beam. For example, when the pair of Tx/Rx beam patterns may uniquely be identified, identification of one of both may be sufficient.

When measuring the predefined beam pattern, for example, in step 330, 430 and/or 450, in-band emissions of a communication band utilized by the apparatus 14 for forming the predefined beam pattern 18 may be measured and/or evaluated. Further, the measurement environment 12 may be configured for measuring out-of-band emissions of the communication band. For evaluating the beam, in-band emissions may be of primary interest as the location, shape and/or direction may advantageously be evaluated when using the in-band emissions. As indicated in FIG. 8, the predefined beam pattern may comprise at least one beam.

Figure 9:
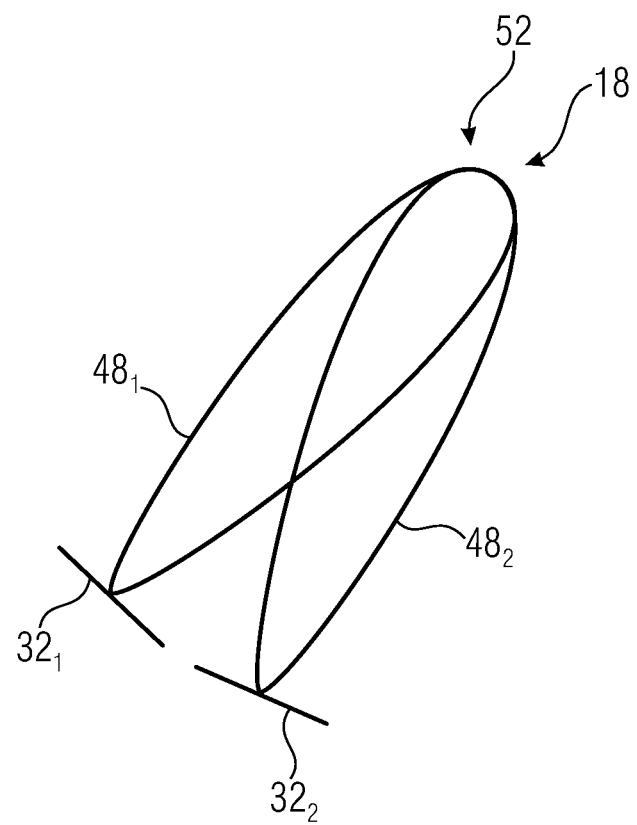
FIG. 9 shows a schematic block diagram of the predefined beam pattern of FIG. 1 according to an embodiment and describing further details with respect to the predefined beam pattern.

FIG. 9 shows a schematic block diagram of the predefined beam pattern 18 according to an embodiment and describing further details with respect to the predefined beam pattern 18. The predefined beam pattern 18 comprises by way of example a superposition of a first beam/lobe 481 and a second beam/lobe 482 so as to form a combined beam 52, at least in the far field. A radiated power of the beams 481 and 482 may thus combine, wherein each of the beams 481 and 482 may be generated with a different antenna arrays/panels or, alternatively, with different antenna elements of a same antenna array. The beams 481 and 482 may be distinguishable for the measurement environment or system or indistinguishable. As described in connection with the training signal, for example, the beams 481 and 482 may be formed using distinguishable pilot elements or pilot signals such that the measurement environment when evaluating said pilots may distinguish between both beams and may thus enable evaluation of both, the partial beams 481 and 482 and the combined beam 52. Alternatively, the measurement environment may be configured for evaluating the beam power while neglecting pilot information such that the measurement environment is aware of the beam 52 while being unable to distinguish between the beams 481 and 482.

The predefined beam pattern 18 may be a static beam pattern or a time variant beam pattern. I.e., by adapting, for example, a transmission power of the beams 481 and 482, a direction of the beam 52 may be varied. Thus, a change in the predefined beam pattern formed may be obtained as well as by switching one or more beams or beam patterns on or off that may also be varied by adapting the beam itself. By use of the signal 24, the predefined beam pattern may be formed independently from a link antenna. Further, the predefined beam pattern may be formable repeatedly and deterministically.

Further, distinguishable beams may not necessarily have to overlap. Distinguishable beams allow further to use at least a first and a second beam pattern in parallel, possibly identifying them by the pilot signal/symbol such as a sounding reference signal and by evaluating them in parallel, wherein such differences may be referred to as at least partially distinguishable, e.g., when using orthogonal pilots in an OFDM system only in a subset of the pilot carriers. The signaling may be performed so as to enable a closed loop request and acknowledge concept. If useful, the apparatus may be rotated or moved after having formed a sequence of beams, but such a movement may be implemented rarely so as to save measurement time. In other words, measurements of total radiated power and the equivalent isotropic radiated power and/or effective isotropic sensitivity have to be conducted such that a sufficiently large number of beams is measured which are formed by the apparatus and the emitted and/or received power or pattern of each beam may be measured. For every beam the full or partial sphere has to be scanned/measured which might involve a substantial effort in measurement time. Embodiments provide a significant reduction measurement time, e.g., for TRP, EIS and EIRP measurements.

In other words, superposition of beams describes the fact that electromagnetic fields associated with each transmitted/received beam superimpose at locations in space as well at antennas used for transmission/reception of the communication signals. Depending on the structure of the signals/symbols modulated onto the RF carrier used for the wireless radio communication. e.g. in current LTE, WiFi and future 5G systems complex QAM symbols are mapped onto OFDM carriers in a time/frequency manner representing data symbols to transfer information/data from the transmitter to the receiver and known reference symbols in order to estimate the wireless channel based on such known pilots and after channel estimation, to equalize the wireless channel and to reconstruct the transmitted data symbols.

Considering such mechanism, reference symbols are often used to make beams identifiable, therefore if several beams are identifiable by different RS or data symbols, a suitable measurement system/equipment can differentiate the different beams or part of the beams, while other parts of the signals transmitted via the beams are indistinguishable and therefore from a receiver point of view are equivalent to a beam jointly created out of two beams exploiting the superposition principle. Furthermore, the measurement system may be adapted to use sensors for energy detection only so as to allow the beams to be not indistinguishable even if they differ in the used RS, data payload or even allocated frequency resources. According to an embodiment, an apparatus is configured and/or controlled so as to generate at least a first beam pattern and a second beam pattern, i.e., a measurement beam set is generated, whilst the beam patterns are at least partially distinguishable. The measurement environment may be adapted to use the information about the distinguishability to measure a plurality of beam patterns, i.e., the measurement beam set in parallel so as to reduce measurement time.

Figure 10A:
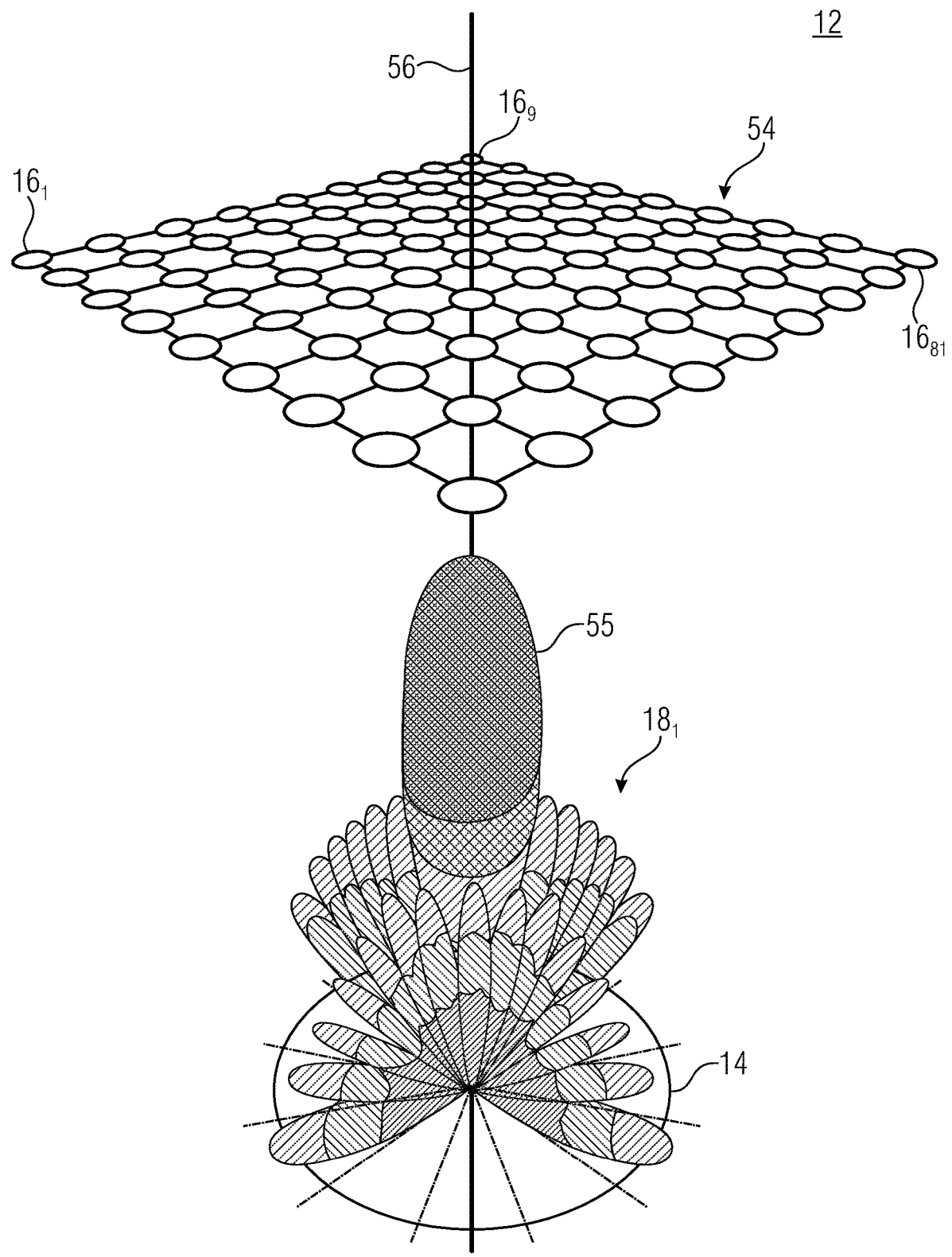
FIG. 10*a-c* show an apparatus in a measurement environment forming different predefined beam patterns.

FIG. 10a shows a schematic perspective view of a surface of the apparatus 14 being directed towards a grid 54 of sensors 16; of the measurement environment 20, wherein a first predefined beam pattern $18_1$ is formed that has a first direction with respect to the grid 54. The predefined beam pattern $18_1$ may comprise a main lobe 55 having a first direction being, for example, directed along a reference direction 56 in the measurement environment 12.

Figure 10B:
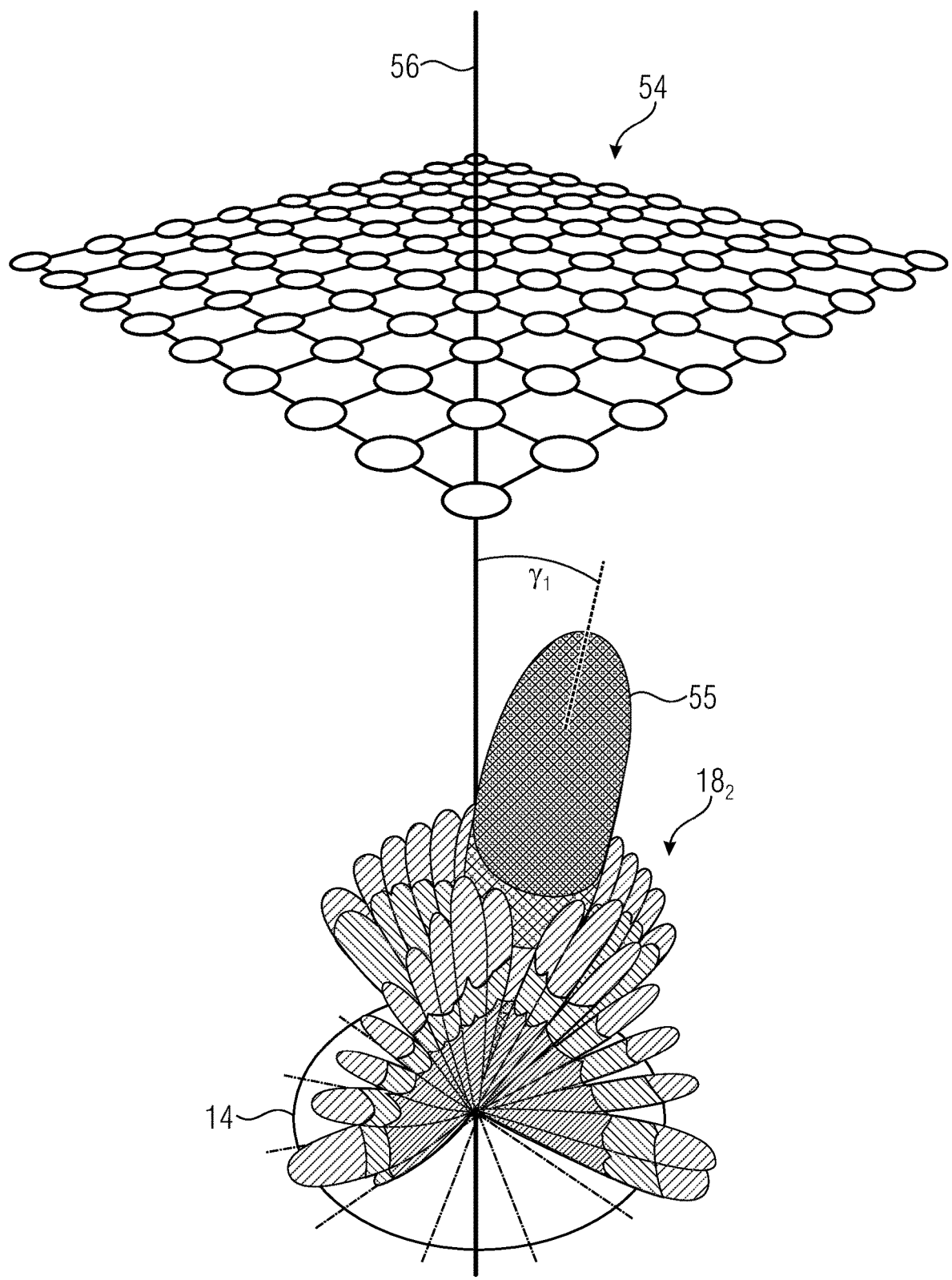

FIG. 10b shows a schematic perspective view of a surface of the apparatus 14 forming a second predefined beam pattern $18_2$ in which the main lobe 55 is inclined with respect to the reference direction 55 by an angle $\gamma_1$.

Figure 10C:
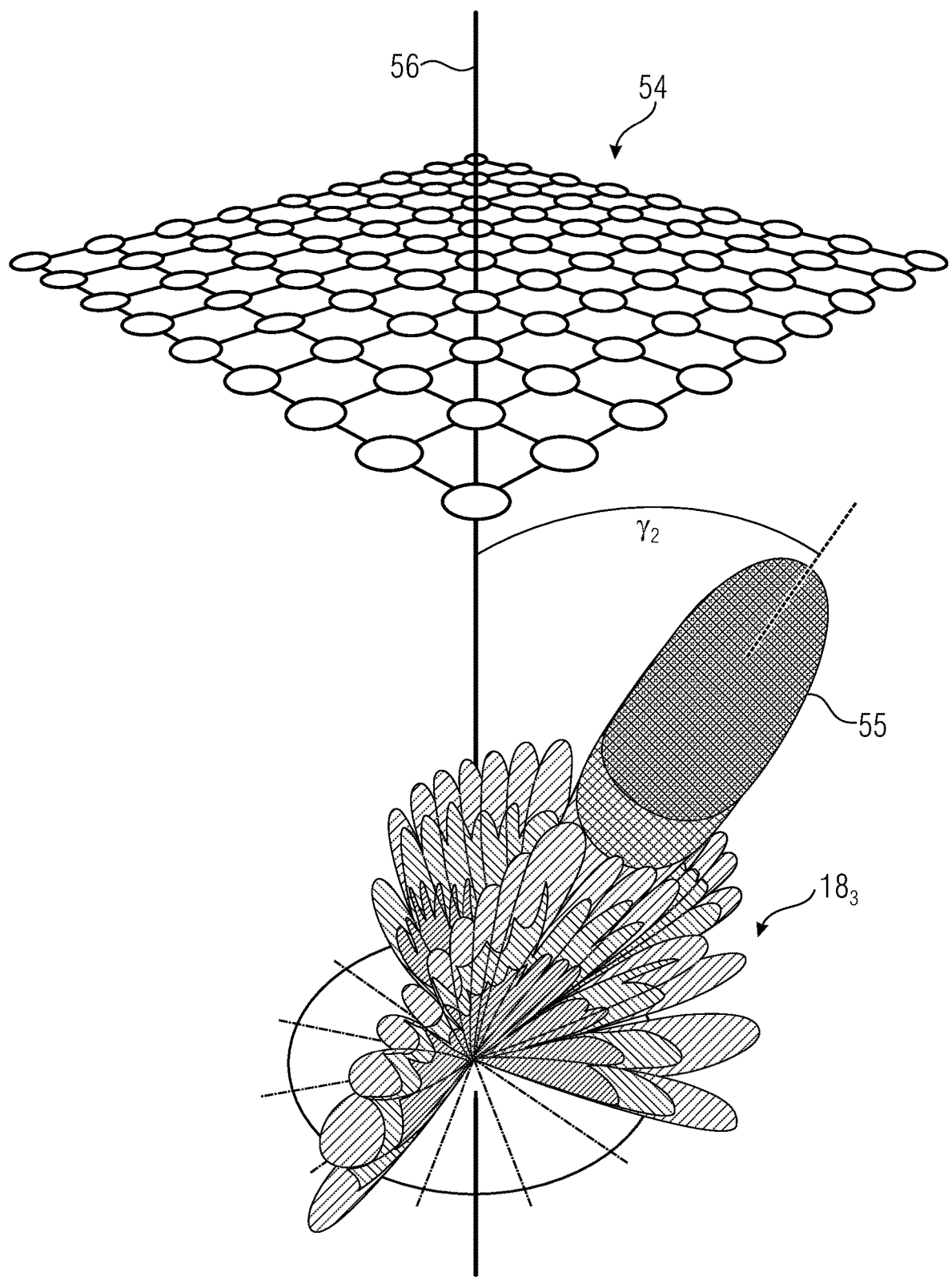

FIG. 10c shows a schematic perspective view of a surface of the apparatus 14 forming a third predefined beam pattern $18_3$ in which the main lobe 55 is inclined with respect to the reference direction 55 by an angle $\gamma_2$.

Each of the predefined beam patterns may be formed without moving the apparatus 14 and/or whilst moving the apparatus simultaneously in a predefined way. Alternatively or in addition to one or more of the predefined beam patterns $18_1$ to $18_3$ one or more beam sweeps may be executed such that the predefined beam patterns $18_1$ to $18_3$ may also be considered as different states of a sweep.

Although some aspects of the present invention are directed towards forming a sequence of static and/or sweeping predefined beam patterns and to change a position/orientation of the apparatus afterwards, possibly followed by a further sequence of predefined beam patterns, the invention is not limited hereto but also defines embodiments according to which the apparatus is moved in a predefined way whilst forming the predefined beam pattern or sequence thereof. Thus, while forming the predefined beam pattern or a sequence thereof, the apparatus may have a static or varying position/orientation.

An idea underlying the present embodiments lies in ID-ing beams, polarization and/or carrier frequencies and mapping the beams to antenna ports of the apparatus, i.e., to parametrize the beams generated. Different beam patterns may comprise a different number of beams, a different beam with, split beam patterns, etc. Embodiments are directed to a multibeam pattern characterization while avoiding a high number of repositioning of the apparatus. The signaling may be performed either by an individual ID-command, possibly using an acknowledgement or by broadcasting to a plurality of apparatus. Advantageously, a predefined beam sequence and/or time duration is used, the beam sequence and time duration being communicated to the apparatus or being stored thereon previously.

When compared to over-the-air measurements for TRP and EIRP in device and antenna array specification which may be used to form a beam and to measure TRP and EIRP for this beam, known methods use a concept to measure EIRP/TRP by use of one or several power sensors distributed around the device under test and creation of a relative movement/rotation of the apparatus against the measurement system. This may be done by mounting the apparatus on a 3D-position and stepwise or continuous rotation of the apparatus such that a spherical coverage of the measurement is achieved. In order to capture the TRP and/or EIS/EIRP, when used for various/different beams formed by apparatus have to be repeatedly done for many or all possible beams to be formed by the apparatus have to be measured. In contrast, embodiments base on the idea to enable an end-to-end measurement procedure including an associated signaling:

1. Define or request a set of supported beams to be defined such that, e.g., these beams provide a sufficiently good spherical coverage with beam directions distributed suitably over a part of the sphere to be covered, i.e., define the predefined beam patterns. Alternatively, other suitable metrics to derive, e.g., TRP and/or EIS, EIRP can be chosen/defined. A set of beams can also include different polarizations transmitted into the same direction or with the same beam shape. In detail, this means that if a particular beam is defined, an associated candidate with the complementary polarization may be defined as well. In order to support this feature, the link antennas and/or the probe/measurement antennas may be able to differentiate between polarizations or may be able to be reconfigured to measure/detect different polarization states.
2. Number the beams such that the apparatus and the measurement system are aware which beam of the set of beams was actuated during a certain measurement step.
3. Given the set of beams as defined and the beams of the set are numbered/marked by an ID coordinate the measurement of, e.g., TRP and/or EIS, EIRP such that apparatus and measurement process are aware and synchronize which beam ID is active and to be measured at a particular time instance/period.
4. In case of mounting of the apparatus on a positioner: for every position/angle to be measured, do:
   a. go to position/angle $\alpha 1$, $\beta 1$, $\theta 1$
   b. initiate beams switching procedure
   c. request to switch beams automatically in a known order or request individually selected beams
      i. for each beam perform the target measurement needed for e.g., TRP, EIRP, EIS between a given relative apparatus-sensor/probe position
      ii. for each beam in case of receive beam measurement DUT feedbacks the measurement result
   d. once all beams of the set are measured: go to position/angle $\alpha 2$, $\beta 2$, $\theta 2$
5. The measurement for all beams at each position can be subject to further processing like averaging, determining the maximum or other operations.
6. The feedback between the DUT and the measurement environment in 4.c.ii. may also be performed at the end of the measurement routine in 4 for all beam IDs and angles. This may be useful as not always a connection between measurement environment and DUT will be available.

Since beam switching can be done very fast and usually within microseconds, the system can measure for all beams under investigation at one position before moving to the next position.

In order to initiate and perform such coordinated switched measurements between multiple beams emitted from an active antenna array interface for signaling and/or synchronization has to be defined. The IF has to be defined between the apparatus and the measurement system/measurement environment. Such interface may include the following functions to be supported:

1. Time Synchronization Between:
    a Beam switching/beam selection and measurement procedure performed by the measurement environment, e.g., length of pilot sequence used for measurement, useful averaging, etc.
    b. Beam switching/beam selection and measurement procedure initiated by the measurement environment and measured by the DUT in case of receive beam measurements, e.g., length of pilot sequence used for measurement, useful averaging, Rx Trigger, Rx measurement timing etc.
    c. Beam switching/beam selection and relative positions between apparatus and measurement environment, e.g., include guard intervals between reposition steps or resend after every step.
2. Definition of beam sets by the apparatus and/or the measurement environment considering capabilities like beam tuning range of the apparatus and measurement method of the measurement environment and the DUT in receive beam measurement.
3. Numbering and/or addressing of beam sets and/or beams in the set of beams.
    a. Exchange information about a predefined set of beams defined/selected by the apparatus; and/or
    b. exchange information regarding a set of beams requested by the measurement environment according to specific feature geometries of the measurement environment or other factors;
    c. using a procedure like the following:
        i. apparatus is put into a position A1 with a relative position to the link antenna. Then, the apparatus is selecting an appropriate beam towards the link antenna. Then, the lock beam command is sent and executed followed by an "ID beam parameter n percent store" in order to recall the same beam setting parameters ID-A1 for later procedures. Note that in case of beam correspondence between Tx and Rx the setting may contain the information to set Tx and Rx. In other cases it may contain, for example, only Rx or Tx information.
        ii. apparatus is put into a position A2 and all next steps as described for position A1 are executed, resulting in a stored beam parameter set for ID-A2.
        iii. Once the whole set of beams is defined by the above-described procedure, the beam set or parameters describing it, e.g., number of beams, etc. is exchanged between apparatus and measurement environment for a later recall addressing or batch recalling during the fast beam switching procedure was forming the measurements.
4. Signaling for support of individual or consecutive steps to initiate, perform and confirm stepwise actions for the measurement procedure including signals like lock beam, release beam, lock power, Tx-Rx flag, etc.

Currently, beam-forming using active antenna arrays and associated OTA conformance and performance testing is quite new and under discussion in, e.g., 3GPP WG RAN4.

Procedures to measure key performance indicators like TRP, EIS and EIRP are defined such that equivalent or different methods are useful in terms of measurement uncertainties but various methods are possible to be applied. These potential measurements include single and multi-probe/sensor measurement environments and scanning of the sphere to be measured by moving the apparatus, the sensor(s) or both of them.

Since for various measurements the particular KPI has to be measured for each or at least some of the possible beams formed with the antenna array, the overall measurement time that may be used can be in the orders of hours and days. Embodiments provide for a significant reduction of this measurement time and provides advantages in the following aspects:

1. A whole set of beams can be measured OTA for any relative position of the apparatus and the measurement system/environment around.
2. Beam switching can be done very fast, in order of the microseconds, while changing the relative position of the apparatus and measurement system is in the order of seconds due to involved mechanics.
3. No order of the beam switching allows batching switching processes with minimum signaling between apparatus and measurement system.
4. Synchronization of a beam-switching process, the measurement process of a particular KPI and change of relative angle between apparatus and MS allows fully automated measurements over longer periods with minimal signaling between apparatus and MS.
5. Knowledge about a set of beams and numbering may allow to request select beams to be activated specifically, while others are not activated during particular phases/periods of the overall measurement. This may further reduce measurement time and allows, e.g., angle or beam direction dependent measurement improvements.
6. A combination of a selective measurement grid and selective choice of beam sets or beams from the set of beams may allow further reduction of the measurement process.
7. In case of a synchronized and batched measurement procedure with no or sparse signaling between the apparatus and the MS, the measurement process can be done even through the link between an apparatus and MS on RRC connected state or a test interface control link is interrupted. This may enable a more robust measurement procedure being more robust against disturbances or specific unfortunate measurement geometries during the measurement process. Furthermore, any measurement which can be continued without reception due to a temporal signaling loss contribute significantly to a measurement time reduction.
8. Instead of using a positioner for all positions use a certain link probe distribution over a part or the complete angular range of interest where these probes can either work in a switched manner or base station reference symbols, e.g. CSI-RS are used to stimulate the link antennas in parallel. This can be applied in a hybrid mode where positioner and multiple link probe antennas are used to cover the complete angular range of interest.

The embodiments described above allow, amongst other things, a short measurement time for evaluating an apparatus or DUT in over-the-air measurement environments. OTA measurements and the definition of their associated measurement grids aim to reduce test time; satisfy the need to reduce the number of measurement points; allow the combination of coarse and fine measurement grids; to elaborate the further study of measurement grids and their effect on TRP statistics; the application of Rx scan knowledge to Tx scan optimization; and an optimization of Rx scans.

Within this topics two general observations can be made:

Observation 1: Issue to be addressed—reduction of measurement uncertainty; and

Observation 2: Issue to be addressed—reduction of measurement time.

With regard to the concept of training beams that are recalled during measurements, a high amount of measurement time may be saved when compared to measurements having a mechanical repositioning of the apparatus after each beam formed as shown in the following:

The steps of performing measurements may be rewritten in the form of an algorithmic pseudo-code to which annotation is added that identifies the duration of the following steps: mechanical positioning, $T_{pos}$; link establishment, $T_{est-link}$; beam lock, $T_{lock}$; and measurement time; $T_{meas}$. Two additional variables are introduced: M which represents the number of link angels; and N the number of measurement angles.

FIG. 11a shows an example table presenting the pseudo-code for the known measurement procedure, which is subsequently referred to as the mechanical repositioning method or "Case A". FIG. 11a identifies a loop within a loop or a so-called nested loop.

FIG. 11b shows an example table presenting pseudo-code for a method in accordance with embodiments, i.e., an alternative method to the method illustrated in FIG. 11a. As before, annotation is added to identify the duration of the following steps: mechanical positioning, $T_{pos}$; link establishment, $T_{est-link}$; beam lock, $T_{lock}$; measurement duration, $T_{meas}$; store position and beam state information $T_{store}$; and recall position and beam state information, $T_{recall}$. That is, FIG. 11b presents the pseudo-code for the alternative measurement procedure, which is subsequently referred to as the mechanical repositioning with electronic beam-indexing method or "Case B".

When compared to FIG. 11a, the method according to FIG. 11b contains one loop followed by another, whereas the method according to FIG. 11a contains a so-called nested loop.

Figure 12A:
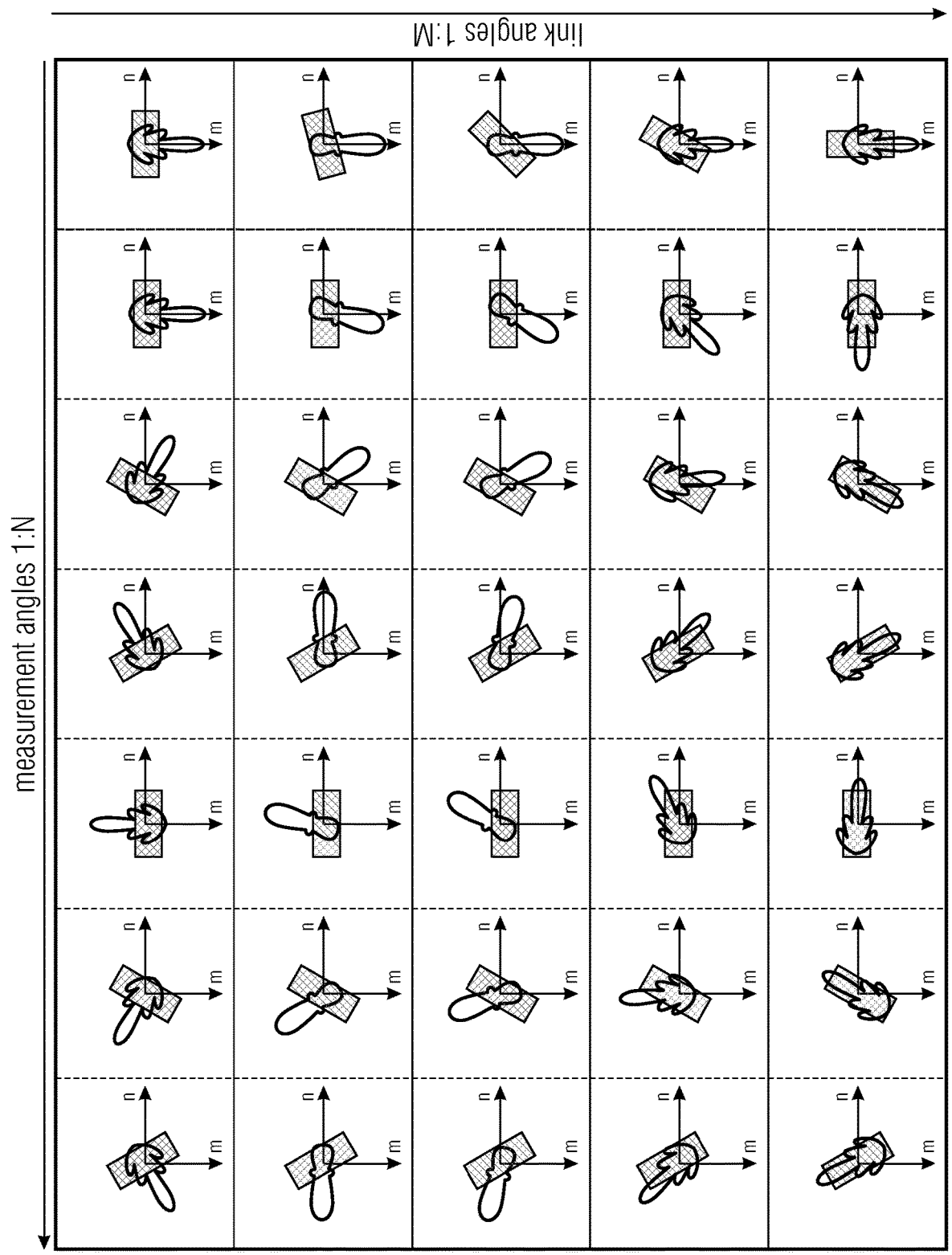
FIG. 12*a* shows a schematic view of mechanical positions that are used for the known method.
Figure 12B:
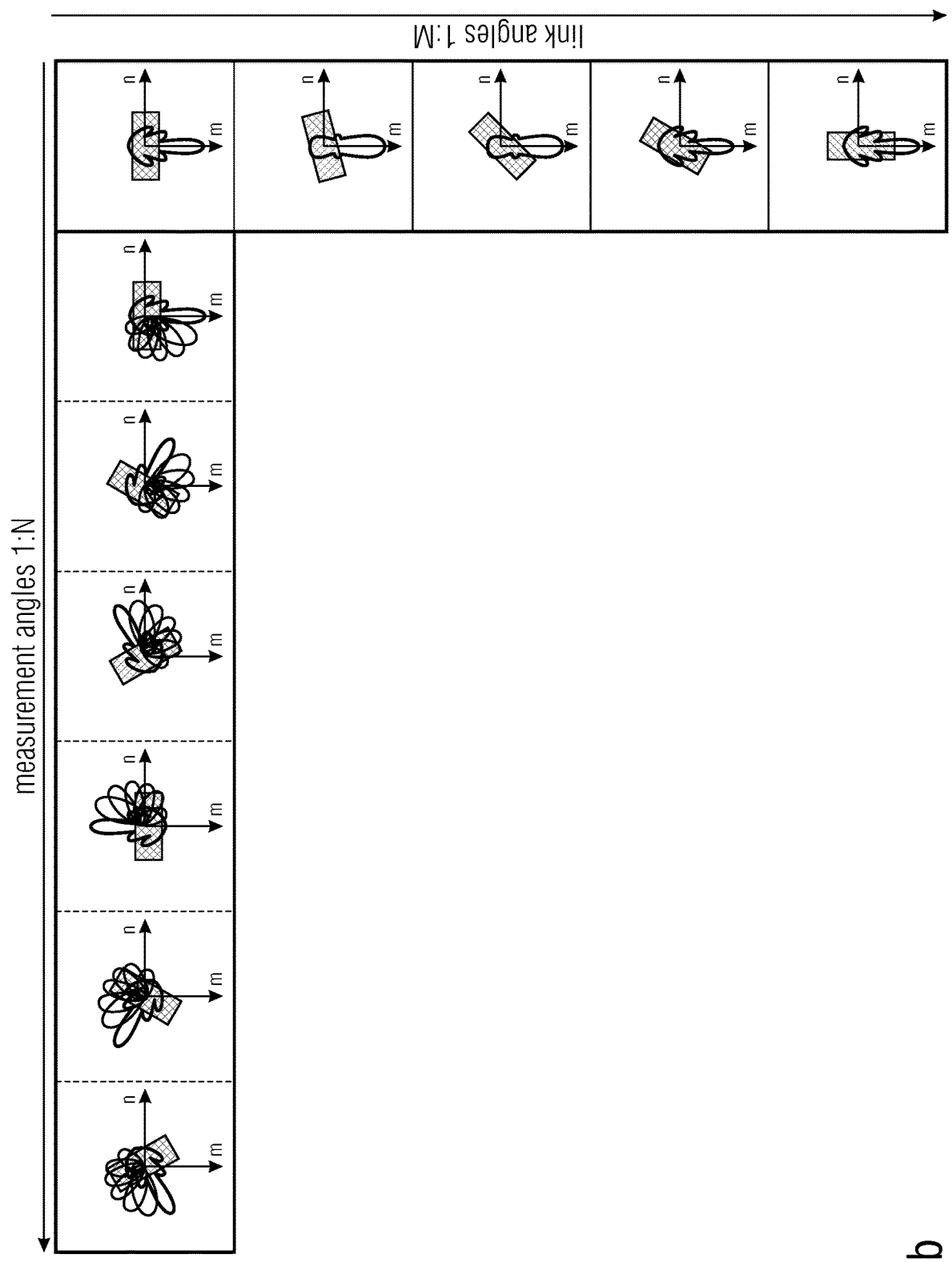
FIG. 12*b* shows a schematic overview of mechanical positions that are used for a method in accordance with an embodiment.

Although in practice the 3D scan may be performed over the surface of an imaginary sphere, a simplified picture in two dimensions can be conveniently used to visualize the measurement methods presented above. FIG. 12a shows a schematic 2D view of the known method of mechanical repositioning measurement according to FIG. 11a, i.e., case A. FIG. 12b shows a schematic 2D view according to FIG. 11b for the mechanical repositioning with electronic beam-indexing measurement, case B.

In FIG. 12a there are clearly many more mechanical positions that may be used to complete the measurement procedure than shown in FIG. 12b. It should be noted that in a practical measurement system, the mechanical rotation of the device under test may use time for acceleration, deceleration and settling before the desired orientation is achieved. In the tables given in FIG. 11a, 11b respectively, all three of these mechanically-related positioning delays are summed together and denoted by the parameter $T_{pos}$. Thus far, improvements of measurement time have mainly focussed on a reduction in the number of measurement points. For a constant step size measurement grid, this is determined by the angular spacing between spatial sampling points whereas for a constant density grid, the number of grid points is the determining factor. A reduction in the number of measurement points is normally associated with an increase in measurement uncertainty.

Even though mechanical positioning may be useful for both the current and the alternative measurement procedure, the pictorial representations of FIG. 12a and FIG. 12b indicate that the total number of mechanical positions can be decreased to N+M instead of N*M without reducing the number of measurement angles. In order to quantify the potential saving in test time, an algebraic analysis of the two measurement procedures may be made.

Observation 3: The total number of mechanical positions can be decreased without reducing the number of measurement angles.

Algebraic Analysis

With reference to the duration parameters listed in FIG. 11a for case A and FIG. 11b for case B, the total time needed to perform a measurement comprised of M link angles and N measurement angles is presented in equations and, respectively.

Case A: mechanical repositioning measurement method $$T_A(M,N) = M[T_{pos} + T_{est-link} + T_{lock} + T_{meas} + N(T_{pos} + T_{meas})] \quad (1)$$
$$= M(T_{pos} + T_{est-link} + T_{lock} + T_{meas}) + NM(T_{pos} + T_{meas})$$

Case B: mechanical repositioning with electronic beam-indexing measurement method $$T_B(M,N) = M[T_{pos} + T_{est-link} + T_{lock} + T_{store}] + \quad (2)$$
$$N[T_{pos} + M(T_{recall} + T_{meas})]$$
$$= M[T_{pos} + T_{est-link} + T_{lock} + T_{store}] +$$
$$NT_{pos} + NM(T_{recall} + T_{meas})$$

Reduction in Measurement Time

The time saving factor is the ratio of the duration of case A to the duration of case B or in other words, the quotient of eqn. and eqn.

$$\frac{T_A}{T_B} = \frac{M(T_{pos} + T_{est-link} + T_{lock} + T_{meas}) + NM(T_{pos} + T_{meas})}{M(T_{pos} + T_{est-link} + T_{lock} + T_{store}) + NT_{pos} + NM(T_{recall} + T_{meas})} \quad (3)$$

Equation 3 can be simplified by assuming that the mechanically-related positioning delays, represented by $T_{pos}$, dominate all other factors as noted in eqn.

$$\text{Assume: } T_{pos} \gg \{T_{est-link}, T_{meas}, T_{store}, T_{recall}, T_{meas}\} \quad (4)$$

Thus $$\frac{T_A}{T_B} \approx \frac{M(T_{pos}) + NM(T_{pos})}{M(T_{pos}) + NT_{pos}} \quad (5)$$

$$= \frac{T_{pos}(M + NM)}{T_{pos}(M + N)}$$

$$= \frac{M + NM}{M + N}$$

Special Conditions

Having simplified the equation to the form shown in eqn., three special conditions are considered.

In the first use case, the number of link angles M is much greater than the number of measurement angles N. Even though this scenario is somewhat unrealistic, eqn. shows that the new method reduces the measurement time by approximately a factor of.

$$1. \; M \gg N \rightarrow \frac{T_A}{T_B} \approx 1 + N \quad (6)$$

Observation 4: When the number of link angles M is much greater than the number of measurement angles N, the new method, case B, reduces the measurement time by approximately a factor of.

In the second use case, the number of measurement angles N is much greater than the number of link angles M and thus represents a typical and realistic scenario. Here the reduction in measurement time offered by the new method is approximately a factor of M times that of the old method.

$$2. \; N \gg M \rightarrow \frac{T_A}{T_B} \approx M \quad (7)$$

Observation 5: When the number of measurement angles N is much greater than the number of link angles M, the new method reduces the measurement time by approximately a factor of M.

In the third use case, the number of measurement angles N is approximately equal to the number of link angles M. For this scenario, the new method promises a potential reduction in measurement time equal to a factor of/2 times that of the old method.

$$3. \; M \approx N \rightarrow \frac{T_A}{T_B} \approx \frac{1 + M}{2} \quad (8)$$

Observation 6: When the number of measurement angles N is approximately equal to the number of link angles M, the new method reduces the measurement time by approximately a factor of/2.

All three conditions show a reduction in measurement time. In particular, when the number of measurement angles N is much greater than the number of link angles M, the new method offers a potential improvement of approximately a factor of M times that of the old method.

Observation 7: The new method offers a reduction in measurement time regardless of the number of measurement angles and link angles.

In other words, measurement scheme according to embodiments target a significant reduction in measurement time, including for example: TRP, EIRP, TRS, EIS, and complex beam radiation pattern measurements.

To further enhance measurements, embodiments relate to reducing measurement uncertainties. For example, such uncertainties may be caused by a low number of sensor elements forming a coarse grid in the measurement environment. Embodiments relate to incorporate a kind of dithering or jittering into the measurements. That is, during the measurements a dithering or jittering of the communication beam patterns generated by the apparatus is generated, e.g., by implementing one or more of a movement of the beam pattern relative to the apparatus and a relative movement between the apparatus and the measurement environment, in particular the sensor elements and/or the one or more link antennas. The movement of a communication beam pattern may be obtained by controlling the apparatus respectively. Alternatively, the relative position/orientation of the apparatus relative to a link antenna may be changed by moving/rotating at least one of both so as to cause the apparatus to adapt the direction of the beam. When having a possibly analogue or quantized control with fine steps, the jittering may be controlled directly. When having more coarse quantization steps, the jittering may be implemented, for example, when adjusting switching points that cause the apparatus to switch from one beam pattern to another, e.g., based on a varied relative position to a link antenna, possibly in connection with a relative movement. That is, the jittering may be applied during step 320, 420 and/or during measurement, e.g., during step 620.

Jittering may be understood as a superposition of an intended movement and a further—jittering or dithering-movement of the beam pattern, i.e., the ideal sweep or position may be falsified. The super positioned jittering, i.e., the jittering may comprise a movement along a single direction according to back and forth with a constant or varying palatial amplitude but is not limited hereto. The movement may be along any number of directions and may implement a movement of e.g., a zig-zag movement, an elliptical movement, a circular movement, a helical or spiral movement, a cross-like movement or according to a polygon such as a triangle.

The jittering movement may be a deterministic movement, e.g., controlling the sweep deterministically so as to move accordingly or may be non-deterministic or random. For example, in connection with a random movement, a lower and an upper boundary of the movement may be set, e.g., vary position of the beam pattern with at most ±5°, ±3° or ±1° and/or vary amplitude of the beam pattern with at most ±10%, ±5% or ±1% and the movement obtained may be random within the boundaries such that statistical properties of the positon and/or amplitude are known.

As described, jittering or dithering may also applied during training. A respective method comprises:
    positioning of the apparatus in a measurement environment or changing the relative position of the probe antenna/antennas of the measurement environment adapted to measure beam patterns and/or beam correspondence between a transmission beam pattern and a reception beam pattern;
    causing the apparatus to form a communication beam pattern as a jittering beam pattern;
    measuring the communication beam pattern so as to obtain a measurement result; and storing the communication beam pattern as predefined beam pattern for a later test dependent on the measurement result.

The beam related information may indicate, if the beam pattern was subjected or is to be subjected with a jitter.

Causing the apparatus to form a jittering beam pattern may comprise controlling the apparatus being suited for such implementations such that a jitter is applied to a signal used to excite an antenna structure or antenna array so as to generate jittering beam pattern. The signal may be an excitation signal, a control signal or the like. Alternatively or in addition the jitter may be implemented by a change of the relative position such that the apparatus implements the jitter responsive to a tracking of the link antenna.

That is, controlling the jittering may be transparent, deterministic or direct by way of providing the apparatus with instructions that cause the beam pattern to show the jittering in a known manner, even if this manner may be selected by use of a random variable. Alternatively or in addition, the jittering may at least partially be obtained by blind or indirect measured that lead to an unknown effect. An example for such a blind measure is to vary a parameter of a plurality of parameters used for beamforming, e.g., an amplitude value and/or a phase value applied to a beamforming network that combines a plurality of amplitude values and phase values. One, a subset or all of the values may be varied deterministic or by random so as to obtain a blind or inknown effect in the beam pattern.

Jittering may be performed such that a main structure of the beam pattern may remain essentially unchanged, for example one or more of a position of main lobes, side lobes nulls, a size thereof and/or a number or relative position thereof may remain unchanged or changed within specific boundaries so as to keep identification of the beam pattern possible.

Figure 13:
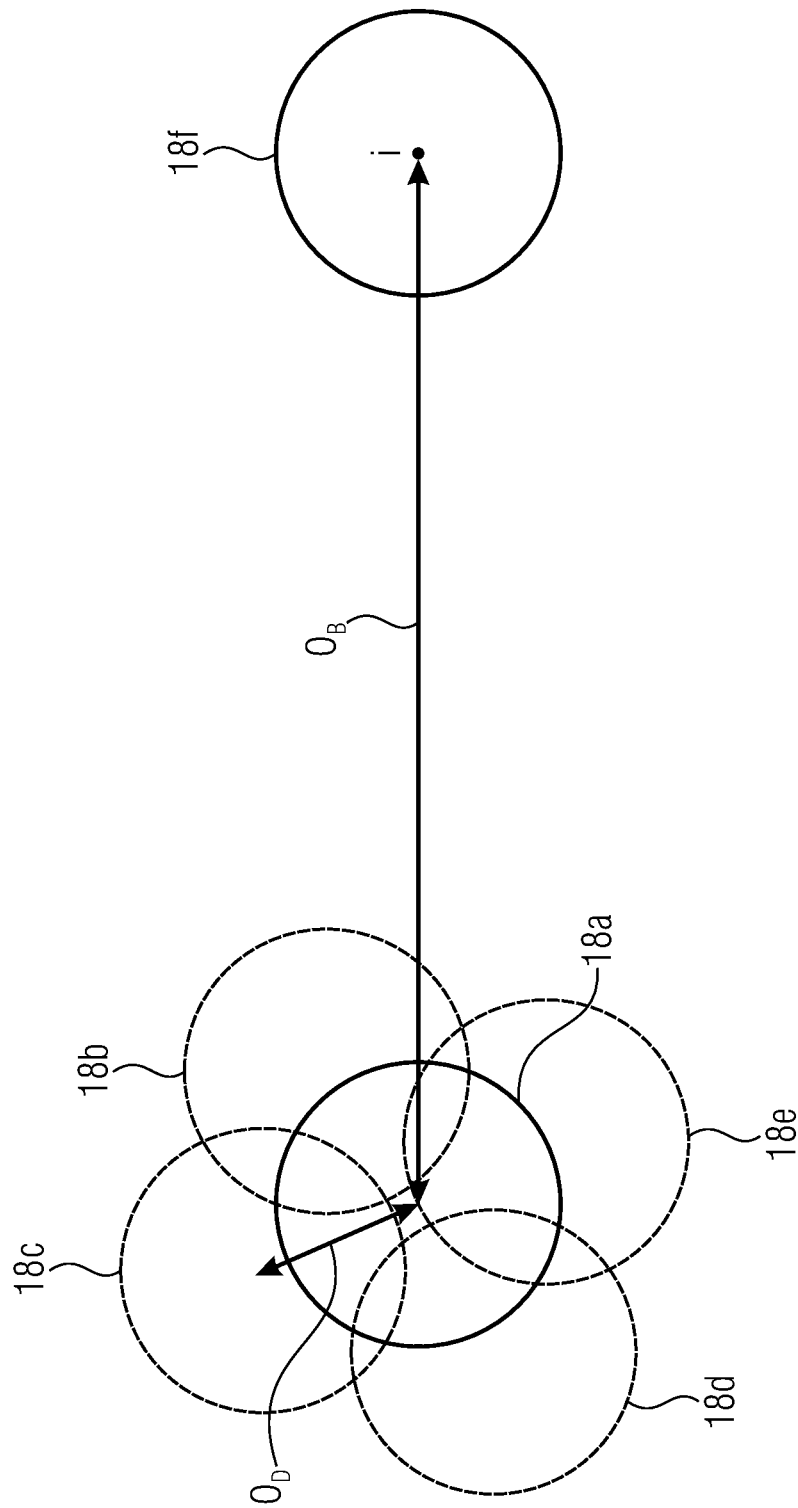
FIG. 13 shows a schematic top view of an example beam pattern that is subjected to a spatial dithering or jittering according to an embodiment.

FIG. 13 shows a schematic top view of an example beam pattern 18a that is subjected to a spatial dithering or jittering according to an embodiment. The beam pattern 18a may be varied so as to have a different direction, size of lobe, or the like so as to sequentially act like dithered beam patterns 18b, 18c, 18d and 18e, being slightly different when compared to the undithered/unjittered beam pattern 18a. For example, a parameter variation is at most 50% or at most 40% or at most 30%, e.g., at most 10% of a parameter variation that may be useful to activate a different beam 18f. For example, an offset Op in direction caused by dithering may be within those boundaries, i.e., a directional offset OB for obtaining a different beam may be larger when compared to Op. By dithering the beam, a maximum of the beam pattern that is possibly offset with respect to a sensor element/probe or a link antenna varies in space and thereby increases the probability that the maximum hits or illuminates the sensor element, the link antenna respectively such that the beam pattern properties may be evaluated with high precision.

For example, during measurements of a transmit beam pattern, by implementing a jittering factor effectively representing an angular change or a steradian, a sensor of the measurement environment may be hit or illuminated by varying portions of the beam pattern and may thus increase the probability to measure a maximum level of power or the like of the beam, i.e., to identify its maximum. Alternatively or in addition, measurement uncertainties obtained by quantizing beam patterns of the apparatus may at least partially be compensated. For example, when only selecting a subset of beam patterns for measurement, as described in connection with FIG. 2, there may be gaps or uncovered spaced in the sphere around the apparatus. Those gaps may be reduced at least partially. A direction of movement of the communication beam patterns may be selected according to a predefined pattern but may also be random.

That is, when doing beam sweeping or beam switching/selection a use of spatial dithering/jittering of a certain amplitude linear or circular zig zag staggered etc. is described in order to create known blurring of pointing to avoid sparse subsampling, to improve measurement resolution with a fixed number of sensors in a specific grid and/or to obtain noise reduction of measurement because of more samples effectively.

Embodiments relate to beam sweeping, i.e., to have a continuous/analogue or discontinuous/digital or quantized movement of the communication beam pattern and/or the calibration beam pattern. For example, it can happen as one reasonable implementation, that the positioner of the measurement environment is controlled so as to constantly moving while the beam is switched/swept still allowing the measurement environment to perform a accurate measurement because of the deterministic nature of the movement of the positioner. This is an overlay of a known beam sweep and the known movement of the positioner.

Figure 14A:
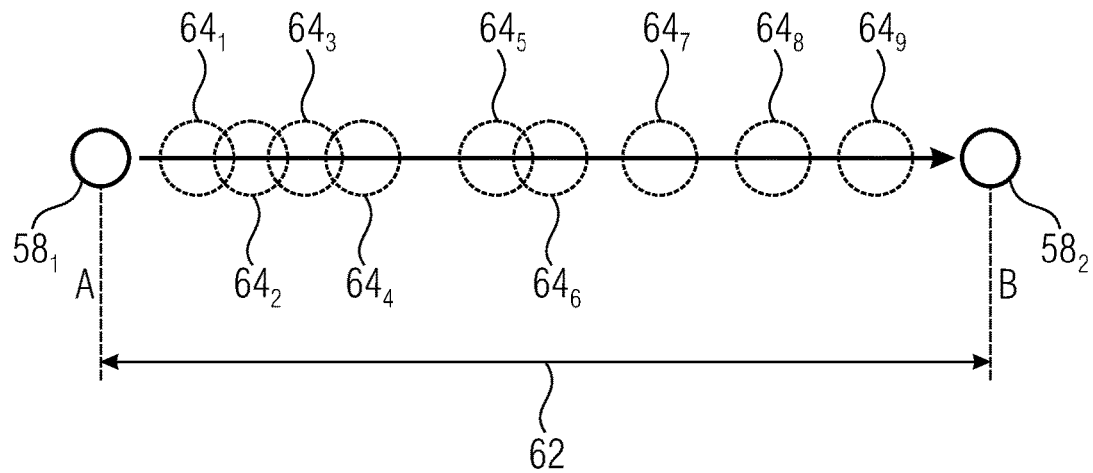
FIG. 14*a* shows a schematic block diagram illustrating a beam sweep according to an embodiment.

A sweep may be obtained by selecting or determining one or more waypoints as illustrated in FIG. 14a. The apparatus may start the beam sweep by forming a first beam towards a first waypoint $58_1$ marked as "A" and may direct its beam starting from waypoint $58_1$ towards a second waypoint $58_2$ marked as "B". As waypoints $58_1$ and $58_2$ may be spaced by a distance 62, the apparatus, e.g., apparatus 14 or 20, may form a communication beam pattern at one or more intermediate locations/directions $64_1$ to $64_9$ wherein the number of such intermediate locations 64 may be arbitrary and/or dependent on the capabilities of the apparatus. Regions where such beams are formed may overlap with adjacent regions as indicated for intermediate locations $64_1$ to $64_3$ but may also be spaced apart from each other as indicated for intermediate locations $64_7$ and $64_8$. For example, a non-linear interpolation between the waypoints $58_1$ and $58_2$ may allow for non-equidistant beams formed, wherein, in contrast, a linear interpolation may lead to equidistant beams. Such beam sweeps may be trained to the apparatus, e.g., when defining a test procedure or the like, and/or implemented by the apparatus by obtaining knowledge about the waypoints.

Although only two waypoints are illustrated, any number of waypoints may be implemented. The number of waypoints may form an open or closed course, e.g., a polygon.

Different sweeps performed by the apparatus may be implemented differently in subsequent iterations and/or positions/orientations of the apparatus. Differences may be implemented, for example, with regard to a sequence according to which the waypoints are addressed, e.g., A→B or B→A and/or with regard to a speed for travelling with the beam pattern from a first waypoint to a second and/or within the complete sweep. For example, when defining the predefined beam patterns during a training sequence, the apparatus may be examined by performing a sweep and by evaluating the results reported by the apparatus or measured with the sensors 16. For example, it may be observed how many intermediate beam patters are formed by the apparatus so as to determine the beam forming capability of the apparatus. This allows for defining a test procedure that is specified towards the apparatus, e.g., it can be prevented to use 100 beams during measurements when the apparatus is capable of forming only a lower amount of beams, e.g., 16 beams. This may allow to reduce measurement time to a useful level. Alternatively or in addition, a tracking capability of the apparatus may evaluated, e.g., when changing a relative position between the apparatus and a link antenna by moving/rotating one or both of them and/or by switching to a different or further link antenna. This may cause the apparatus to form varying beams according to a sweep.

Figure 14B:
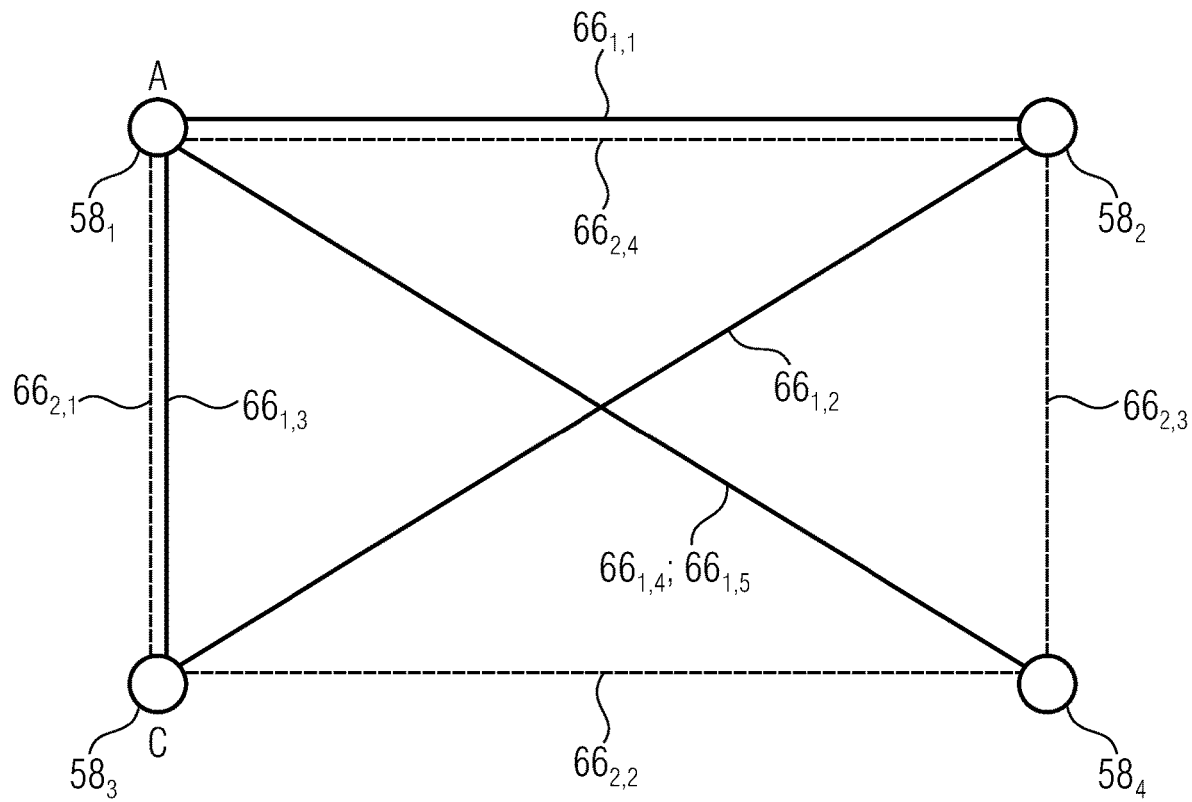
FIG. 14*b* shows a schematic block diagram of a configuration of different pathways with exemplary four waypoints that are interconnected by trajectories according to an embodiment.

FIG. 14b shows a schematic block diagram of a configuration with exemplary four waypoints $58_1$ to $58_4$ that are interconnected by trajectories $66_{i,j}$ wherein i represents the number of the sweep amongst a plurality of sweeps and j represents the number of the trajectory within the sweep i. For example, a first sweep may comprise trajectories $66_{1,1}$, $66_{1,2}$, $66_{1,3}$, $66_{1,4}$, and $66_{1,5}$, so as to travel between waypoints $58_1$, $58_2$, $58_3$ and $58_4$ so as to form a pattern ABCAD. A second sweep along a second pathway may comprise some or all of the first sweep and optionally additional waypoints. Along trajectories $66_{2,1}$, $66_{2,2}$, $66_{2,3}$ and $66_{2,4}$ waypoints $58_1$, $58_3$, $58_4$ and $58_2$ and $58_1$ may be hit or illuminated by such a sweep according to a pattern ACDBA. Both sweeps together may cover a large area so as to obtain detailed measurement results.

Advantageous embodiments relate to a combination of beam sweeping and beam jittering. For example, during the training a subset of predefined beam patterns may be selected and the selected subset may be used to define a beam sweep. Beam sweeping may be comprise an interpolation, linear or non-linear, between two relative angles associated with or directing towards waypoints. Sweeping may further comprise defining a trajectory, e.g., using the waypoints and defining a shortest pathway therebetween. A sequence of the connections between pathways may be changed cyclically or randomly so as to obtain a high number of beams formed between waypoints in the overall test procedure. When using discrete beams, a high or even maximum number of possible beams that may be formed may be generated whilst following the trajectory. This allows for a high reproducibility. The selection of beams may be adapted or changed in one or more further steps or iterations. Along the way from a waypoint to another and/or at the waypoints, respective beam patterns may be subjected to jittering/dithering allowing for a high amount of space to be covered by the beam patterns.

That is, a method according to embodiments may be implemented such that a measurement environment and/or apparatus adapted accordingly are controlled such that a pathway of the beam sweep is determined, during training and/or testing, so as to comprise a plurality of waypoints in space. Further, a sequence of the waypoints is determined, the sequence forming points along a travel route of the beam pattern. Between the at least two waypoints at least one trajectory, is determined, in particular between each pair of subsequent waypoints and optionally between the last and the first waypoint. Each waypoint may occur once or more often in the pathway. The trajectories may interconnect the plurality of waypoints. The apparatus may be controlled so as to form the beam sweep such that a beam pattern is moved according to the pathway of the beam sweep.

The trajectories may describe a shortest way between two waypoints. The beam sweep may be a first beam sweep having a first pathway. In a same or varied relative position, a second and/or a higher number of beam sweeps may be driven such that a corresponding method comprises determining a second beam sweep having a second pathway, the second pathway at least partially comprising the same waypoints as the first pathway and having a sequence of waypoints changed when compared to the first pathway.

In the following, additional embodiments and aspects of the invention will be described which can be used individually or in combination with any of the features and functionalities and details described herein.

Aspect
1. Method (300; 400) for evaluating an apparatus (14) having at least one antenna array (32), the apparatus (14) configured for forming a plurality of communication beam patterns (36) using the antenna array (32), the method comprising:
   positioning (310; 410) of the apparatus (14) in a measurement environment (12) or changing the relative position of the probe antenna/antennas of the measurement environment adapted to measure beam patterns and/or beam correspondence between a transmission beam pattern and a reception beam pattern;
   controlling (320; 420) the apparatus so as to form a predefined beam pattern (18) of the plurality of communication beam patterns (36); and
   measuring (330; 430) the predefined beam pattern (18) using the measurement environment and/or the apparatus.
2. The method of aspect 1, wherein the predefined beam pattern (18) is a first of a plurality of predefined beam patterns (18), the plurality of predefined beam patterns being a subset of the plurality of communication beam patterns, the method further comprising:
   controlling (440) the apparatus (14) so as to form a second predefined beam pattern (18) of the plurality of predefined beam patterns after measuring of the first predefined beam pattern; and
   measuring (450) the second predefined beam pattern using the measurement environment (12) and/or the apparatus.
3. The method of aspect 1 or 2, wherein the predefined beam pattern (18) is a first of a plurality (42; 44) of predefined beam patterns, the plurality (42; 44) of predefined beam patterns being a subset of the plurality of communication beam patterns (36), the method further comprising:
   controlling the apparatus (14) so as to form a third predefined beam pattern of the plurality (42; 44) of predefined beam patterns during measuring of the first predefined beam pattern; and
   measuring the third predefined beam pattern using the measurement environment (12) and/or the apparatus.
4. The method of aspect 3, wherein the apparatus (14) is controlled so as to sequentially form the plurality (42; 44) of predefined beam patterns, and wherein the respective predefined beam pattern is measured, the method further comprising:
   changing a relative position between the apparatus (14) and the measurement environment (12) after having measured the plurality of predefined beam patterns; and
   repeating the controlling of the apparatus for forming and measuring the plurality (42) of predefined beam patterns or a further plurality (44) of predefined beam patterns.
5. The method of aspect 4, wherein the apparatus (14) is controlled so as to form the plurality (42) of predefined beam patters and/or the further plurality (44) of predefined beam patterns in a predefined order.
6. The method of one of previous aspects, wherein the predefined beam pattern (18) is a first predefined beam pattern of a plurality (42; 44) of predefined beam patterns, wherein the method is performed such that a predefined sequence of predefined beam patterns is generated by the apparatus (14) and measured with the measurement environment (12) and/or the apparatus.

7. The method of one of previous aspects, further comprising:
    determining the predefined beam pattern by selecting (610) the predefined beam pattern from the plurality of communication beam patterns (36).

8. The method of one of previous aspects, further comprising:
    controlling the apparatus (14) or a comparable apparatus (20) similar to the apparatus so as to form a calibration beam pattern being one of the plurality of communication beam patterns (36); and
    storing a beam related information ($P_i$) indicating the calibration beam pattern in a memory (37).

9. The method of aspect 8, wherein a plurality of calibration beam patterns is formed and a corresponding plurality of beam related information ($P_i$) is stored in the memory (37).

10. The method of aspect 8 or 9, wherein controlling the apparatus (14) or the comparable apparatus (20) so as to form the calibration beam pattern comprises (36):
    positioning of the apparatus (14) or the comparable apparatus (20) similar to the apparatus so as to comprise a relative position to a link antenna (46) or keeping the position of the apparatus and changing the relative position of the link antenna (46) by movement or switching to another link antenna such that the apparatus (14) or the apparatus forms the calibration beam pattern towards the link antenna (46).

11. The method of aspect 10, wherein controlling the apparatus or the comparable apparatus so as to form the calibration beam pattern further comprises:
    controlling the apparatus (14) or the comparable apparatus (20) so as to lock the beam pattern such that the apparatus (14) or the comparable apparatus (20) maintains a relative orientation of the beam pattern relative to a surface of the apparatus (14) when changing the relative position of the apparatus (14) or the comparable apparatus (20) with respect to the link antenna (41).

12. The method of one of aspects 8 to 11, wherein the calibration beam pattern is a first calibration beam pattern and wherein the beam related information ($P_i$) is a first beam related information, the method comprising:
    changing the relative position between the apparatus (14) or the comparable apparatus (20) and the link antenna (46) such that the apparatus (14) or the comparable apparatus (20) forms a second calibration beam pattern;
    storing a second beam related information ($P_i$) indicating the second calibration beam pattern in the memory (37).

13. The method of one of aspects 8 to 12, wherein the controlling of the apparatus (14) so as to form the predefined beam pattern comprises reading the beam related information from the memory (37) and forming the predefined beam pattern according to the beam related information ($P_i$).

14. The method of one of aspects 8 to 13, wherein the beam related information ($P_i$) comprises at least one of
    a beam/beam sweep identifier;
    an information indicating one or a multitude of beam-related parameter for a transmission and/or reception beam to be applied to the antenna array and/or the associated baseband signal which is to be communicated using the antenna array;
    a beam polarization;
    a carrier frequency of the beam pattern;
    a beam correspondence flag; and
    a beam correspondence ID.

15. The method of one of previous aspects, wherein controlling of the apparatus (14) so as to form the predefined beam pattern (18) of the plurality of communication beam patterns (36) comprises transmitting a configuration (24) to the apparatus by the measurement environment (12), the signal (24) containing information indicating at least one of:
    an activation time and/or a time duration of the predefined beam pattern;
    an activation time and/or a time duration of a beam sweep comprising the predefined beam pattern;
    a time at the apparatus or the measurement environment so as to enable time synchronization;
    an order of predefined beam patterns to be formed by the apparatus; and
    a Tx-Rx flag.

16. The method of aspect 15, wherein beam related information ($P_i$) is stored in a memory (37) of the DUT (14), wherein the signal (24) indicates the beam related information ($P_i$).

17. The method of one of previous aspects, wherein the controlling of the DUT (14) such as to form the predefined beam pattern (18) comprises transmitting a signal (24) from the measurement environment (12) to the DUT (14), the signal (24) comprising information unambiguously indicating the predefined beam pattern (18) or a sequence of a plurality of predefined beam patterns to be formed by the DUT (14).

18. The method of one of previous aspects, wherein measuring (330; 430) the predefined beam pattern comprises at least one of:
    measuring a total radiated power of the beam pattern;
    measuring an equivalent isotropic radiated power;
    measuring an effective isotropic sensitivity;
    measuring Rx and/or Tx complex radiation pattern in magnitude and phase;
    measuring Rx and/or Tx complex radiation pattern in relative magnitude and relative phase;
    measuring a direction of the beam pattern relative to the apparatus;
    and measuring of
        a spherical coverage,
        a covered spherical beam grid density,
        a specific beam pattern of all activated beams of the set of beams,
        at least one side lobe of the main beams/beam patterns,
        a scalability/linearity/hysteresis of beam pattern changes/switching/inflating/deflating,
        spurious emissions/ACLR with spatial resolution,
        capability and accuracy of null steering and multi-beam steering,
        accuracy of beam correspondence, and
        calibration of antenna arrays/panels.

19. The method of one of previous aspects, wherein measuring the (330; 430) predefined beam pattern comprises measuring of in-band emissions of a communication band utilized by the apparatus.

20. The method of aspect 19, wherein measuring the (330; 430) predefined beam pattern further comprises measuring out-of-band emissions of the communication band.
21. The method of one of previous aspects, wherein the beam pattern (18) comprises at least one beam (48).
22. The method of aspect 21, wherein the apparatus (44) is adapted so as to use the at least one beam (481) for superpositioning with another beam (482) so as to form a combined beam (57).
23. The method of aspect 22, wherein the beam (481) and the further beam (482) are distinguishable for the measurement system (42) or indistinguishable.
24. The method of one of previous aspects, wherein predefined beam pattern is a first predefined beam pattern, wherein the apparatus is controlled so as to form the first predefined beam pattern and at least a second predefined beam pattern simultaneously and so as to be at least partially distinguishable, the method comprising evaluation of the first predefined beam pattern and the second predefined beam pattern.
25. The method of one of previous aspects, wherein the predefined beam pattern (18) is a first predefined beam pattern of a plurality (42; 44) of predefined beam patterns, wherein the method comprises controlling the apparatus so as to sequentially form each of the plurality of predefined beam patterns, wherein the plurality of predefined beam patterns is arranged according to a pattern in the measurement environment.
26. The method of aspect 25, wherein the pattern is at least one of
   a regular or irregular pattern;
   a pattern in which the plurality of beams is arranged in an equidistant manner;
   a pattern that covers an azimuth and/or elevation angle range of the apparatus and/or
   a pattern with one, two or a superposition of polarization components.
27. The method of one of previous aspects, wherein the predefined beam pattern is a static beam pattern or a time variant beam pattern.
28. The method of one of previous aspects, wherein the predefined beam pattern (18) describes a static beam pattern or a beam sweep.
29. The method of one of previous aspects, wherein, when controlling the apparatus (14), the predefined beam pattern is formed independently from a link antenna.
30. The method of one of previous aspects, wherein the predefined beam pattern is formable repeatedly and deterministically.
31. The method of one of previous aspects, wherein the controlling (320; 420) of the apparatus so as to form the predefined beam pattern comprises:
   causing the apparatus so as to form the predefined beam pattern as a jittering beam pattern.
32. Method for evaluating a apparatus (14) having at least one antenna array (32), the apparatus (14) configured for forming a plurality of communication beam patterns (36) using the antenna array (32), the method comprising:
   relative positioning of the apparatus (14) in a measurement environment (12) adapted to measure beam patterns;
   controlling the apparatus so as to form a predefined beam pattern being a beam sweep based on a variation of a communication beam pattern (32) over time; and
   measuring the predefined beam pattern (18) using the measurement environment and/or the apparatus.
33. The method of aspect 32, comprising:
   determining a pathway of the beam sweep so as to comprise a plurality of waypoints in space and a sequence of the waypoints and at least one trajectory, between two subsequent waypoints so as to interconnect the plurality of waypoints with trajectories;
   controlling the apparatus so as to form the beam sweep such that a beam pattern is moved according to the pathway of the beam sweep.
34. The method of aspect 33, wherein the trajectories describe a shortest way between two waypoints.
35. The method of aspect 33 or 34, wherein the beam sweep is a first beam sweep having a first pathway, the method further comprising:
   determining a second beam sweep having a second pathway, the second pathway at least partially comprising the same waypoints as the first pathway and having a sequence of waypoints changed when compared to the first pathway.
36. The method of aspect 35, wherein the controlling of the apparatus so as to form the predefined beam pattern comprises:
   causing the apparatus so as to form the predefined beam pattern as a jittering beam pattern.
37. Method for determining a predetermined beam pattern for an apparatus having at least one antenna array (32), the apparatus (14) configured for forming a plurality of communication beam patterns (36) using the antenna array (32), the method comprising:
   positioning of the apparatus (14) in a measurement environment (12) or changing the relative position of the probe antenna/antennas of the measurement environment adapted to measure beam patterns and/or beam correspondence between a transmission beam pattern and a reception beam pattern;
   causing the apparatus to form a communication beam pattern as a jittering beam pattern;
   measuring the communication beam pattern so as to obtain a measurement result; and
   storing the communication beam pattern as predefined beam pattern for a later test dependent on the measurement result.
38. Non-transitory storage medium having stored thereon a computer program having a program code for performing, when running on a computer, a method according to one of previous aspects.
39. An apparatus (14; 20) comprising:
   at least one antenna array, wherein the apparatus is configured for forming a plurality of communication beam patterns using the antenna array;
   a memory having stored thereon beam related information unambiguously indicating at least one of the plurality of communication beam patterns as a predefined beam pattern;
   an interface configured for receiving a signal indicating a request to form the predefined beam pattern;
   wherein the apparatus is configured for forming the predefined beam pattern responsive to the signal using the beam related information.
40. The apparatus of aspect 39, wherein the apparatus is configured for forming the predefined beam pattern as a jittering beam pattern.
41. The apparatus of aspect 40, wherein the apparatus is configured for obtaining the jittering bam pattern by applying a jitter to a signal used to excite an antenna structure or antenna array so as to generate jittering beam pattern.
42. Non-transitory storage medium having stored thereon a beam identification signal indicating a request to an apparatus to form a predefined beam pattern.
43. A measurement environment (12) comprising:
   a holding unit (26) configured to hold an apparatus (14); and
   a control unit (22) adapted to execute instructions, the instructions configured to cause the measurement environment and/or the apparatus (14) to execute a method of one of previous aspects.
44. The measurement environment according to aspect 43, wherein the measurement environment is configured to receive, from the apparatus, a beam configuration associated with the communication beam pattern, the beam configuration comprising a plurality of beam settings, each beam setting comprising at least one of a
   unique beam setting identifier;
   a beam power;
   a beam gain;
   a beam directivity;
   a beam carrier frequency;
   a beam polarization;
   a beam direction;
   a beam bandwidth part;
   a beam usage;
   a list of values with the correspondent settings of the antenna arrays in Tx and/or Rx to form the beam;
   a beam correspondence flag;
   a beam correspondence ID.
45. The measurement environment according to aspect 43 or 44, wherein the measurement environment is configured to receive responsive to a trigger signal transmitted to the apparatus, from the apparatus, receive beam measurement result(s) associated with a unique beam identifier comprising a plurality of measurement results and parameters, comprising at least one of:
   a unique beam setting identifier;
   a Received Signal strength Indicator (RSSI);
   a Reference Signal Received Power (RSRP);
   a Reference Signal Received Quality (RSRQ);
   a power e.g. in case of arbitrary test signals;
   a frequency setting;
   a magnitude and phase at defined frequency;
   a relative magnitude and relative phase at a defined frequency; and
   a beam direction, like an angle of arrival.
46. The measurement environment according to one of aspects 43 to 45, wherein the measurement environment is configured to signal a trigger signal to the apparatus to initiate the feedback of receive beam measurement result(s) associated with unique beam identifiers.
47. The measurement environment of one of aspects 43 to 46, being configured for receiving receive beam measurement results for a sequence of beam setting identifiers in response to a trigger signal.
48. The measurement environment of one of aspects 43 to 47, wherein the measurement environment is configured to cause the apparatus to form the predefined beam pattern as a jittering beam pattern.
49. The measurement environment of aspect 48, wherein the measurement environment is configured to implement a jitter by applying a jitter to the relative position between the apparatus and a sensor and/or a link antenna of the measurement environment.
50. An apparatus (14; 20), wherein the apparatus is configured to feedback, receive beam measurement result(s) associated with unique beam identifiers comprising a plurality of measurement results and parameters, but at least one of:
   a unique beam setting identifier;
   a Received Signal strength Indicator (RSSI);
   a Reference Signal Received Power (RSRP);
   a Reference Signal Received Quality (RSRQ);
   a power e.g. in case of arbitrary test signals;
   a frequency setting;
   a magnitude and phase at defined frequency;
   a relative magnitude and relative phase at a defined frequency; and
   a beam direction, like an angle of arrival.
51. An apparatus (14; 20), wherein the apparatus is configured to receive a trigger signal from a measurement environment and is further configured to initiate the feedback of receive beam measurement result(s) associated with unique beam identifiers.
52. The apparatus of one of aspects 50 or 51, being configured for transmitting receive beam measurement results for a sequence of beam setting identifiers in response to a trigger signal.
53. The apparatus of one of aspects 50 to 52, wherein the apparatus is configured to form the predefined beam pattern as a jittering beam pattern.
54. An apparatus (14; 20) comprising:
   at least one antenna array (32), wherein the apparatus (14;20) is configured for forming a plurality of communication beam patterns (36) using the antenna array (32);
   wherein the apparatus is configured for transmitting a beam configuration associated with the communication beam pattern, the beam configuration comprising a plurality of beam settings, each beam setting comprising at least one of a unique beam setting identifier;
   a beam power;
   a beam gain;
   a beam carrier frequency;
   a beam polarization;
   a beam direction;
   a beam bandwidth part;
   a beam usage;
   a list of values with the correspondent settings of the antenna arrays in Tx and/or Rx to form the beam;
   a beam correspondence flag; and
   a beam correspondence ID.
55. The apparatus of aspect 54, wherein the apparatus is a communication device, wherein the antenna array is adapted as a transmitter and/or receiver, the apparatus comprising:
   a transceiver configured to receive, from a measurement environment, a signal comprising a beam setting identifier, wherein the beam setting identifier is associated with a beam setting of the beam configuration, and
   a controller configured to control the apparatus so as to form a communication beam pattern of the plurality of communication beam patterns according to the beam setting with the transmitter.

56. The apparatus of aspect 54 or 44, wherein the apparatus is a communication device, wherein the antenna array is adapted as a transmitter and/or receiver, the apparatus comprising:
- a transceiver configured to receive, from a measurement environment, a signal comprising information indicating a configuration comprising a beam setting comprising at least one of
  - a beam power;
  - a beam gain;
  - a beam carrier frequency;
  - a beam polarization;
  - a beam direction;
  - a beam bandwidth part;
  - a beam usage;
  - a list of values with the corresponding settings of the antenna arrays in Tx and/or Rx to form the beam;
  - a Tx-Rx flag to identify if the Rx or Tx beam is measured; and
  - a Rx Trigger indicating a request to the apparatus to measure the receive beam pattern and to transmit associated measurement results to a measurement environment.
- wherein the apparatus comprises a controller configured for applying the beam setting to form a predefined beam pattern being one of the plurality of communication beam patterns, with the transmitter and/or receiver.

57. The apparatus of one of aspects 54 to 56, wherein the antenna array is adapted as a transmitter and/or receiver, wherein the apparatus is configured for receiving, from a measurement environment, a sequence of beam setting identifiers comprising a plurality of beam setting identifiers and for receiving at least a first and a second trigger signal, wherein each beam setting identifier of the sequence is associated with a beam setting of a beam configuration of the apparatus; and
- wherein the apparatus comprises a controller configured for applying a first beam setting to form a first predefined beam pattern of the plurality of communication beam patterns with the transmitter and/or receiver in response to the first triggering signal, and for applying the second beam setting as indicated by the sequence to form a second predefined beam pattern of the plurality of communication beam patterns in response to the second triggering signal using the transmitter and/or the receiver.

58. The apparatus of one of aspects 54 to 57, wherein the antenna array is adapted as a transmitter and/or receiver, wherein the apparatus is configured for receiving, from a measurement environment, a sequence of beam setting identifiers, a trigger signal and a time duration indicator, wherein each beam setting identifier of the sequence is associated with a beam setting of the beam configuration of the apparatus; and
- wherein the apparatus comprises a controller configured for applying sequentially in response to the triggering signal the beam settings one-by-one as indicated by the sequence, and wherein for each beam setting the apparatus is configured for forming a predefined beam pattern of the plurality of communication beam patterns using the transmitter and/or receiver for keeping the formed predefined beam pattern fixed for a time duration indicated by the time duration indicator.

59. The apparatus of one of aspects 54 to 58, wherein the apparatus is configured for transmitting a beam-formed training signal responsive to a signal received from a measurement environment.

60. The apparatus of one of aspects 54 to 59, wherein the apparatus is configured for receiving at least one training signal from a measurement environment to perform receive beam measurements.

61. The apparatus of one of aspects 54 to 60, wherein the apparatus is configured for receiving, from a measurement environment, a signal indicating a beam setting measurement request, and
- wherein the apparatus comprises a controller configured
  - for generating a beam setting as a part of the beam configuration of the apparatus;
  - for applying the beam setting so as to form a beam pattern towards a link antenna using the transmitter;
  - for storing the generated beam setting in a memory, and
  - for controlling the apparatus so as to, in response to the beam setting measurement request, report the beam setting to the measurement environment.

62. The apparatus of one of aspects 54 to 61, wherein the apparatus is configured for reporting its beam configuration capability indicating the total number of supported beam settings of the beam configuration of the apparatus, to a measurement environment.

63. The apparatus of one of aspects 54 to 62, wherein the apparatus is configured to form the communication beam patterns as jittering beam patterns.

64. A measurement environment (12) comprising:
- a holding unit (26) configured to hold an apparatus (14; 20), the apparatus comprising at least one antenna array (32), wherein the apparatus (14) is configured for forming a plurality of communication beam patterns (36) using the antenna array(s) (32); and
- a control unit (22) adapted to execute instructions, such that the measurement environment adapts the apparatus so as to form a plurality of communication beam patterns (36) using the antenna array(s) (32); and to instruct the apparatus so as to transmit a beam configuration of a formed communication beam pattern, the beam configuration comprising at least one of
  - a unique beam setting identifier;
  - a beam power;
  - a beam gain;
  - a beam carrier frequency;
  - a beam polarization;
  - a beam direction;
  - a beam bandwidth part;
  - a beam usage;
  - a list of values with the correspondent settings of the antenna arrays in Tx and/or Rx to form the beam;
  - a beam correspondence flag; and
  - a beam correspondence ID.

65. The measurement environment of aspect 64, wherein the apparatus is a communication device, wherein the antenna array is adapted as a transmitter and/or receiver, wherein the measurement environment is configured for:
- transmitting, to the apparatus, a signal comprising a beam setting identifier, wherein the beam setting identifier is associated with a beam setting of the beam configuration, so as to instruct the apparatus to form a communication beam pattern of the plurality of communication beam patterns according to the beam setting with the transmitter;
wherein the beam configuration comprising a plurality of beam settings, wherein each beam setting comprises at least one of
a beam power;
a beam gain;
a beam carrier frequency;
a beam polarization;
a beam direction;
a beam bandwidth part; and
a beam usage;
a list of values with the correspondent settings of the antenna arrays in Tx and/or Rx to form the beam;
a Tx-Rx flag to identify if the Rx or Tx beam is measured; and
a Rx Trigger indicating a request to the apparatus to measure the receive beam pattern and to transmit associated measurement results to a measurement environment.
66. The measurement environment of aspect 64 or 65, wherein the apparatus is a communication device, wherein the antenna array is adapted as a transmitter and/or receiver, wherein the measurement environment is configured for:
transmitting, to the apparatus, a signal comprising a beam setting comprising at least one of
a beam power;
a beam gain;
a beam carrier frequency;
a beam polarization;
a beam direction;
a beam bandwidth part;
a list of values with the correspondent settings of the antenna arrays in Tx and/or Rx to form the beam;
a Tx-Rx flag to identify if the Rx or Tx beam is measured; and
a Rx Trigger indicating a request to the apparatus to measure the receive beam pattern and to transmit associated measurement results to a measurement environment;
so as to instruct the apparatus to apply the beam setting to form a predefined beam pattern being one of the plurality of communication beam patterns, with the transmitter.
67. The measurement environment of one of aspects 64 to 66, wherein the antenna array of the apparatus is adapted as a transmitter and/or receiver, wherein the measurement environment is configured for transmitting, to the apparatus, a sequence of beam setting identifiers comprising a plurality of beam setting identifiers and for transmitting, to the apparatus, at least a first and a second trigger signal, wherein each beam setting identifier of the sequence is associated with a beam setting of a beam configuration of the apparatus;
so as to instruct the apparatus to apply a first beam setting to form a first predefined beam pattern of the plurality of communication beam patterns with the transmitter and/or the receiver in response to the first triggering signal, and to apply the second beam setting as indicated by the sequence to form a second predefined beam pattern of the plurality of communication beam patterns in response to the second triggering signal using the transmitter and/or receiver.

68. The measurement environment of one of aspects 64 to 67, wherein the antenna array of the apparatus is adapted as a transmitter and/or receiver, wherein the measurement environment is configured to transmitting, to the apparatus, a sequence of beam setting identifiers, a trigger signal and a time duration indicator, wherein each beam setting identifier of the sequence is associated with a beam setting of the beam configuration of the apparatus;
so as to instruct the apparatus to apply sequentially in response to the triggering signal the beam settings one-by-one as indicated by the sequence, and so as to, for each beam setting, form a predefined beam pattern of the plurality of communication beam patterns using the transmitter and/or receiver and to keep the formed predefined beam pattern fixed for a time duration indicated by the time duration indicator.
69. The measurement environment of one of aspects 64 to 68, wherein the measurement environment is configured for transmitting a signal, to the apparatus, so as to instruct the apparatus to transmit a beam-formed training signal.
70. The measurement environment of one of aspects 64 to 69, wherein the measurement environment is configured for transmitting, to the apparatus, a signal indicating a beam setting measurement request, so as to instruct the apparatus to
generate a beam setting as a part of the beam configuration of the apparatus;
apply the beam setting so as to form a beam pattern towards a link antenna using a transmitter of the apparatus;
store the generated beam setting in a memory, and
control the apparatus so as to, in response to the beam setting measurement request, report the beam setting to the measurement environment.
71. The measurement environment of one of aspects 64 to 70, wherein the measurement environment is configured for receiving, from the apparatus, a report of its beam configuration capability indicating the total number of supported beam settings of the beam configuration of the apparatus, and to evaluate the beam configuration capability during a measurement procedure.
72. The measurement environment of one of aspects 64 to 71, wherein the measurement environment is configured to cause the apparatus to form the predefined beam pattern as a jittering beam pattern.
73. A controller adapted to:
control an apparatus (14; 20) comprising at least one antenna array, wherein the apparatus is configured for forming a plurality of communication beam patterns using the antenna array, so as to form at least one predefined beam pattern of the communication beam patterns using beam related information;
control a measurement environment so as to measure the predefined beam pattern using the beam related information.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can partially be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Method for evaluating an apparatus comprising at least one antenna array, the apparatus configured for forming a plurality of communication beam patterns using the antenna array, the method comprising:
    positioning of the apparatus in a measurement environment or changing the relative position of the probe antenna/antennas of the measurement environment adapted to measure beam patterns or beam correspondence between a transmission beam pattern and a reception beam pattern;
    controlling the apparatus so as to form a predefined beam pattern of the plurality of communication beam patterns; and
    measuring the predefined beam pattern using the measurement environment or the apparatus;
    wherein the predefined beam pattern is a first of a plurality of predefined beam patterns, the plurality of predefined beam patterns being a subset of the plurality of communication beam patterns,
    wherein the apparatus is controlled so as to sequentially form the plurality of predefined beam patterns, and wherein the respective predefined beam pattern is measured, the method further comprising:
    changing a relative position between the apparatus and the measurement environment after having measured the plurality of predefined beam patterns; and
    such that the apparatus is controlled to the plurality of predefined beam patterns or a further plurality of predefined beam patterns in the changed relative position; the method comprising the further plurality of predefined beam patterns in the changed relative position.

2. The method of claim 1, the method further comprising:
    controlling the apparatus so as to form a second predefined beam pattern of the plurality of predefined beam patterns after measuring of the first predefined beam pattern; and
    measuring the second predefined beam pattern using the measurement environment or the apparatus.

3. The method of claim 1, the method further comprising:
    controlling the apparatus so as to form a third predefined beam pattern of the plurality of predefined beam patterns during measuring of the first predefined beam pattern; and
    measuring the third predefined beam pattern using the measurement environment or the apparatus.

4. The method of claim 1, wherein the apparatus is controlled so as to form the plurality of predefined beam patters or the further plurality of predefined beam patterns in a predefined order.

5. The method of claim 1, wherein the predefined beam pattern is a first predefined beam pattern of a plurality of predefined beam patterns, wherein the method is performed such that a predefined sequence of predefined beam patterns is generated by the apparatus and measured with the measurement environment or the apparatus.

6. The method of claim 1, further comprising:
    determining the predefined beam pattern by selecting the predefined beam pattern from the plurality of communication beam patterns.

7. The method of claim 1, further comprising:
    controlling the apparatus or a comparable apparatus similar to the apparatus so as to form a calibration beam pattern being one of the plurality of communication beam patterns; and
    storing a beam related information indicating the calibration beam pattern in a memory.

8. The method of claim 7, wherein a plurality of calibration beam patterns is formed and a corresponding plurality of beam related information is stored in the memory.

9. The method of claim 7, wherein controlling the apparatus or the comparable apparatus so as to form the calibration beam pattern comprises:
    positioning of the apparatus or the comparable apparatus similar to the apparatus so as to comprise a relative position to a link antenna or keeping the position of the apparatus and changing the relative position of the link antenna by movement or switching to another link antenna such that the apparatus or the apparatus forms the calibration beam pattern towards the link antenna.

10. The method of claim 9, wherein controlling the apparatus or the comparable apparatus so as to form the calibration beam pattern further comprises:
controlling the apparatus or the comparable apparatus so as to lock the beam pattern such that the apparatus or the comparable apparatus maintains a relative orientation of the beam pattern relative to a surface of the apparatus when changing the relative position of the apparatus or the comparable apparatus with respect to the link antenna.

11. The method of claim 7, wherein the calibration beam pattern is a first calibration beam pattern and wherein the beam related information is a first beam related information, the method comprising:
changing the relative position between the apparatus or the comparable apparatus and the link antenna such that the apparatus or the comparable apparatus forms a second calibration beam pattern;
storing a second beam related information indicating the second calibration beam pattern in the memory.

12. The method of claim 7, wherein the controlling of the apparatus so as to form the predefined beam pattern comprises reading the beam related information from the memory and forming the predefined beam pattern according to the beam related information.

13. The method of claim 7, wherein the beam related information comprises at least one of
a beam/beam sweep identifier;
an information indicating one or a multitude of beam-related parameter for a transmission or reception beam to be applied to the antenna array or the associated baseband signal which is to be communicated using the antenna array;
a beam polarization;
a carrier frequency of the beam pattern;
a beam correspondence flag; and
a beam correspondence ID.

14. The method of claim 1, wherein controlling of the apparatus so as to form the predefined beam pattern of the plurality of communication beam patterns comprises transmitting a configuration to the apparatus by the measurement environment, the signal comprising information indicating at least one of:
an activation time or a time duration of the predefined beam pattern;
an activation time or a time duration of a beam sweep comprising the predefined beam pattern;
a time at the apparatus or the measurement environment so as to enable time synchronization;
an order of predefined beam patterns to be formed by the apparatus; and
a Tx-Rx flag.

15. The method of claim 14, wherein beam related information is stored in a memory of the DUT, wherein the signal indicates the beam related information.

16. The method of claim 1, wherein the controlling of the Dutch as to form the predefined beam pattern comprises transmitting a signal from the measurement environment to the DUT, the signal comprising information unambiguously indicating the predefined beam pattern or a sequence of a plurality of predefined beam patterns to be formed by the DUT.

17. The method of claim 1, wherein measuring the predefined beam pattern comprises at least one of:
measuring a total radiated power of the beam pattern;
measuring an equivalent isotropic radiated power;
measuring an effective isotropic sensitivity;
measuring Rx or Tx complex radiation pattern in magnitude and phase;
measuring Rx or Tx complex radiation pattern in relative magnitude and relative phase;
measuring a direction of the beam pattern relative to the apparatus;
and measuring of
a spherical coverage,
a covered spherical beam grid density,
a specific beam pattern of all activated beams of the set of beams,
at least one side lobe of the main beams/beam patterns,
a scalability/linearity/hysteresis of beam pattern changes/switching/inflating/deflating,
spurious emissions/ACLR with spatial resolution,
capability and accuracy of null steering and multi-beam steering,
accuracy of beam correspondence, and
calibration of antenna arrays/panels.

18. The method of claim 1, wherein measuring the predefined beam pattern comprises measuring of in-band emissions of a communication band utilized by the apparatus.

19. The method of claim 18, wherein measuring the predefined beam pattern further comprises measuring out-of-band emissions of the communication band.

20. The method of claim 1, wherein the beam pattern comprises at least one beam.

21. The method of claim 20, wherein the apparatus is adapted so as to use the at least one beam for superpositioning with another beam so as to form a combined beam.

22. The method of claim 21, wherein the beam and the further beam are distinguishable for the measurement system or indistinguishable.

23. The method of claim 1, wherein predefined beam pattern is a first predefined beam pattern, wherein the apparatus is controlled so as to form the first predefined beam pattern and at least a second predefined beam pattern simultaneously and so as to be at least partially distinguishable, the method comprising evaluation of the first predefined beam pattern and the second predefined beam pattern.

24. The method of claim 1, wherein the predefined beam pattern is a first predefined beam pattern of a plurality of predefined beam patterns, wherein the method comprises controlling the apparatus so as to sequentially form each of the plurality of predefined beam patterns, wherein the plurality of predefined beam patterns is arranged according to a pattern in the measurement environment.

25. The method of claim 24, wherein the pattern is at least one of
a regular or irregular pattern;
a pattern in which the plurality of beams is arranged in an equidistant manner;
a pattern that covers an azimuth or elevation angle range of the apparatus or
a pattern with one, two or a superposition of polarization components.

26. The method of claim 1, wherein the predefined beam pattern is a static beam pattern or a time variant beam pattern.

27. The method of claim 1, wherein the predefined beam pattern describes a static beam pattern or a beam sweep.

28. The method of claim 1, wherein, when controlling the apparatus, the predefined beam pattern is formed independently from a link antenna.

29. The method of claim 1, wherein the predefined beam pattern is formable repeatedly and deterministically.

30. The method of claim 1, wherein the controlling of the apparatus so as to form the predefined beam pattern comprises:
causing the apparatus so as to form the predefined beam pattern as a jittering beam pattern.

31. Non-transitory storage medium having stored thereon a computer program comprising a program code for performing, when running on a computer, a method for evaluating an apparatus comprising at least one antenna array, the apparatus configured for forming a plurality of communication beam patterns using the antenna array, said method comprising:
positioning of the apparatus in a measurement environment or changing the relative position of the probe antenna/antennas of the measurement environment adapted to measure beam patterns or beam correspondence between a transmission beam pattern and a reception beam pattern;
controlling the apparatus so as to form a predefined beam pattern of the plurality of communication beam patterns; and
measuring the predefined beam pattern using the measurement environment or the apparatus;
wherein the predefined beam pattern is a first of a plurality of predefined beam patterns, the plurality of predefined beam patterns being a subset of the plurality of communication beam patterns,
wherein the apparatus is controlled so as to sequentially form the plurality of predefined beam patterns, and wherein the respective predefined beam pattern is measured, the method further comprising:
changing a relative position between the apparatus and the measurement environment after having measured the plurality of predefined beam patterns; and
such that the apparatus is controlled to the plurality of predefined beam patterns or a further plurality of predefined beam patterns in the changed relative position; the method comprising measuring the plurality of predefined beam patterns or the further plurality of predefined beam patterns in the changed relative position.

32. Non-transitory storage medium having stored thereon a beam identification signal indicating a request to an apparatus to form a predefined beam pattern.

33. A measurement environment comprising:
a holding unit configured to hold an apparatus; and
a control unit adapted to execute instructions, the instructions configured to cause the measurement environment or the apparatus to execute a method for evaluating an apparatus comprising at least one antenna array, the apparatus configured for forming a plurality of communication beam patterns using the antenna array, said method comprising:
positioning of the apparatus in a measurement environment or changing the relative position of the probe antenna/antennas of the measurement environment adapted to measure beam patterns or beam correspondence between a transmission beam pattern and a reception beam pattern;
controlling the apparatus so as to form a predefined beam pattern of the plurality of communication beam patterns; and
measuring the predefined beam pattern using the measurement environment or the apparatus;
wherein the predefined beam pattern is a first of a plurality of predefined beam patterns, the plurality of predefined beam patterns being a subset of the plurality of communication beam patterns,
wherein the apparatus is controlled so as to sequentially form the plurality of predefined beam patterns, and wherein the respective predefined beam pattern is measured, the method further comprising:
changing a relative position between the apparatus and the measurement environment after having measured the plurality of predefined beam patterns; and
such that the apparatus is controlled to the plurality of predefined beam patterns or a further plurality of predefined beam patterns in the changed relative position; the method comprising measuring the plurality of predefined beam patterns or the further plurality of predefined beam patterns in the changed relative position.

34. The measurement environment according to claim 33, wherein
the measurement environment is configured to receive, from the apparatus, a beam configuration associated with the communication beam pattern, the beam configuration comprising a plurality of beam settings, each beam setting comprising at least one of
a unique beam setting identifier;
a beam power;
a beam gain;
a beam directivity;
a beam carrier frequency;
a beam polarization;
a beam direction;
a beam bandwidth part;
a beam usage;
a list of values with the correspondent settings of the antenna arrays in Tx or Rx to form the beam;
a beam correspondence flag;
a beam correspondence ID.

35. The measurement environment according to claim 33, wherein the measurement environment is configured to receive responsive to a trigger signal transmitted to the apparatus, from the apparatus, receive beam measurement result(s) associated with a unique beam identifier comprising a plurality of measurement results and parameters, comprising at least one of:
a unique beam setting identifier;
a Received Signal strength Indicator (RSSI);
a Reference Signal Received Power (RSRP);
a Reference Signal Received Quality (RSRQ);
a power e.g. in case of arbitrary test signals;
a frequency setting;
a magnitude and phase at defined frequency;
a relative magnitude and relative phase at a defined frequency; and
a beam direction, like an angle of arrival.

36. The measurement environment according to claim 33, wherein the measurement environment is configured to signal a trigger signal to the apparatus to initiate the feedback of receive beam measurement result(s) associated with unique beam identifiers.

37. The measurement environment of claim 33, being configured for receiving receive beam measurement results for a sequence of beam setting identifiers in response to a trigger signal.

38. The measurement environment of claim 33, wherein the measurement environment is configured to cause the apparatus to form the predefined beam pattern as a jittering beam pattern.

39. The measurement environment of claim 38, wherein the measurement environment is configured to implement a jitter by applying a jitter to the relative position between the apparatus and a sensor or a link antenna of the measurement environment.

40. A controller adapted to:
control an apparatus comprising at least one antenna array, wherein the apparatus is configured for forming a plurality of communication beam patterns using the antenna array, so as to form at least one predefined beam pattern of the communication beam patterns using beam related information;
control a measurement environment so as to measure the predefined beam pattern using the beam related information.

* * * * *